(12) United States Patent
Gil-Arias

(10) Patent No.: US 10,766,745 B2
(45) Date of Patent: Sep. 8, 2020

(54) UNIVERSAL AND SOFTWARE-CONFIGURABLE ELEVATOR DOOR MONITOR

(71) Applicant: Argus Elevator LLC, Marietta, GA (US)

(72) Inventor: Omar Gil-Arias, Marietta, GA (US)

(73) Assignee: Argus Elevator LLC, Marietta, GA (US)

(*) Notice: Subject to any disclaimer, the term of this patent is extended or adjusted under 35 U.S.C. 154(b) by 0 days.

(21) Appl. No.: 16/581,008

(22) Filed: Sep. 24, 2019

(65) Prior Publication Data
US 2020/0095094 A1    Mar. 26, 2020

Related U.S. Application Data

(60) Provisional application No. 62/736,175, filed on Sep. 25, 2018.

(51) Int. Cl.
*B66B 13/14* (2006.01)
*G01R 13/02* (2006.01)
(Continued)

(52) U.S. Cl.
CPC .............. *B66B 13/143* (2013.01); *B66B 1/06* (2013.01); *B66B 5/0018* (2013.01); *G01R 15/04* (2013.01)

(58) Field of Classification Search
CPC ........ B66B 13/143; B66B 1/06; B66B 5/0018
(Continued)

(56) References Cited

U.S. PATENT DOCUMENTS 4,506,765 A     3/1985  Payne et al.
4,750,591 A  *  6/1988  Coste ................... B66B 5/0006
                                                      187/391
(Continued)

FOREIGN PATENT DOCUMENTS

CN    106365010    2/2017
CN    106395531    2/2017
(Continued)

OTHER PUBLICATIONS

Adams Elevator; Flyer for Safe-T-Lock, publicly available prior to Sep. 25, 2018, 2 pg.
(Continued)

*Primary Examiner* — Christopher Uhlir
(74) *Attorney, Agent, or Firm* — Taylor English Duma LLP

(57) ABSTRACT

An elevator door monitor eliminates the need to use customized input devices or modules in an elevator door monitoring system. The elevator door monitor employs differential amplifier circuits, one circuit for each of a plurality of signals to be monitored regarding an elevator car, each signal corresponding to a separate input into a microcontroller unit ("MCU"). Each differential amplifier circuit electrically communicates with a respective input terminal of the MCU, which can include a memory resource storing settings associated with respective elevator control parameters. A user can enter each setting using a peripheral input device. These settings provide system customization in lieu of hardware components, allowing the elevator door monitor to function as a universal system that can monitor a variety of elevators.

23 Claims, 27 Drawing Sheets

(51) Int. Cl.
  *B66B 5/00* (2006.01)
  *B66B 1/06* (2006.01)
  *G01R 15/04* (2006.01)

(58) Field of Classification Search
  USPC .................................. 187/247, 391, 393, 396
  See application file for complete search history.

(56) References Cited

U.S. PATENT DOCUMENTS

| | | | |
|---|---|---|---|
| 4,930,604 A * | 6/1990 | Schienda | B66B 5/0006 187/393 |
| 5,644,111 A | 7/1997 | Cerny et al. | |
| 5,760,350 A * | 6/1998 | Pepin | B66B 13/143 187/316 |
| 5,780,787 A * | 7/1998 | Kamani | B66B 13/143 187/316 |
| 5,817,993 A * | 10/1998 | Kamani | B66B 13/143 187/316 |
| 6,193,019 B1 * | 2/2001 | Sirigu | B66B 13/22 187/391 |
| 6,484,125 B1 * | 11/2002 | Huang | B66B 5/0006 187/393 |
| 6,854,565 B2 * | 2/2005 | Perala | B66B 5/0006 187/247 |
| 7,350,626 B2 * | 4/2008 | Lence | B66B 1/34 187/247 |
| 8,941,964 B2 | 1/2015 | Madar | |
| 8,997,941 B2 * | 4/2015 | Abad | B66B 13/22 187/391 |
| 9,376,289 B2 * | 6/2016 | Herkel | B66B 1/14 |
| 9,988,239 B2 * | 6/2018 | Toutaoui | B66B 5/0025 |
| 10,227,208 B2 * | 3/2019 | De Coi | B66B 5/0031 |
| 2014/0075431 A1 | 3/2014 | Kumar et al. | |
| 2014/0379910 A1 | 12/2014 | Saxena | |
| 2017/0254842 A1 | 9/2017 | Bahl et al. | |

FOREIGN PATENT DOCUMENTS

| | | |
|---|---|---|
| CN | 107445004 | 12/2017 |
| CN | 207293846 | 5/2018 |
| RU | 2148008 | 4/2000 |
| RU | 15716 | 11/2000 |
| RU | 34739 | 12/2003 |
| RU | 62913 | 5/2007 |

OTHER PUBLICATIONS

Adams Elevator; Safe-T-Lock Survey Sheet, publicly available prior to Sep. 25, 2018, 2 pgs.

Gal Manufacturing Co., LLC; Presentation for ECNY: Faulty Door Contact Circuit Monitoring, dated Feb. 8, 2018, 50 pgs.

Claddagh Controls Corp.; Specification sheet for Door Lock Jumper Monitor with Remote Monitoring, publicly available prior to Sep. 25, 2018, 1 pg.

Claddagh Electronics Ltd.; Article entitled: "Door Lock Jumper Monitoring System", available at <http://claddaghelectronics.com/content/12-door-lock-monitoring>, accessed on Jul. 31, 2018, 1 pg.

Electrodyn; Flyer for MONIDOR door and gate monitor, publicly available prior to Sep. 25, 2018, 2 pgs.

Rolls Elevator Safety USA Inc.; Brochure for FSSG Best Elevator Door Monitor: No More Elevator Run with Open Door, publicly available prior to Sep. 25, 2018, 1 pg.

Rolls Elevator Safety USA Inc.; Brochure for FSSG to Prevent Elevator Accidents: Best Door Locks By-pass Detector, publicly available prior to Sep. 25, 2018, 1 pg.

Rolls Elevator Safety USA Inc.; Brochure for FSSG to Prevent Elevator Accidents: FSSG+UCM is the only device to ensure that Your Elevator will never move with open doors, publicly available prior to Sep. 25, 2018, 1 pg.

Rolls Elevator Safety USA Inc.; web page entitled: "FSSG—Fail Safe Safety Guard Approved in NYC and Released", located at <http://www.rolls-elevator.com/fssg>, accessed on Aug. 8, 2018, 6 pgs.

Rolls Elevator Safety USA Inc.; Brochure titled "FSSG Best Elevator Door Monitor / No More Elevator Run with Open Door," publicly available prior to Sep. 25, 2018, 1 pg.

Rolls-Elevator; Brochure for FSSG: A way to prevent Elevator Accident, publicly available prior to Sep. 25, 2018, 2 pgs.

* cited by examiner

UNIVERSAL AND SOFTWARE-CONFIGURABLE ELEVATOR DOOR MONITOR

CROSS-REFERENCE TO RELATED APPLICATION

This application claims the benefit of U.S. Provisional Patent Application Ser. No. 62/736,175, filed Sep. 25, 2018, the disclosure of which is hereby incorporated by reference herein in its entirety.

TECHNICAL FIELD

This disclosure relates to elevator control systems. More specifically, this disclosure relates to a device working in tandem with an elevator controller to facilitate the control of elevator operations.

BACKGROUND

Elevator door monitors are devices that enhance the functionality and safety of elevator control systems. Conventional door monitoring systems rely on customization of the input stage, so that they can be compatible with different types of control systems. The most common device for interfacing with an elevator controller is a relay. A relay is an electromechanical switch that activates only if: (i) an input voltage applied to the relay equals or exceeds a built-in threshold voltage value, and (ii) the current entering the relay is of the type (AC or DC) at which the relay is configured to operate. Input relays are used for translating voltage at different levels into a normalized voltage that can be used by an elevator controller. Each monitoring device within conventional systems monitors the door(s) of a single elevator car. Each such device monitors several different types of signals to accomplish that task, including but not limited to Door Fully Closed (DFC), Door Fully Open (DFO), Door Gate Switch (DGS), Hoistway Door Lock (HDL), and Fireman Service 2 (FS2). Furthermore, many conventional input devices or modules (including but not limited to relay-based devices) use at least one relay per each signal that needs to be monitored in order to address variability in voltage level and types. When one of the signals that needs to be monitored changes state, the elevator controller transmits a voltage via a current (again, of type either AC or DC) to the input device. If that preset voltage equals or exceeds the built-in threshold voltage of that input device (and the current types match), the input device activates and thereby communicates the sensed state of that particular signal to the logic block of the door monitor. If the voltage entering the relay is below the built-in threshold voltage value, the input device remains inactive. Thus, successful operation of a conventional monitoring system requires that the built-in threshold voltage value of the input device match the preset change-of-state voltage of the elevator car, and that the current types are the same for both the elevator and the relay.

There is a lack of uniformity in the design of elevator controllers, such that one elevator of a building frequently generates a change-of-state voltage at a different magnitude than that of another elevator, and also possibly via differing current types. This can especially be the case if some elevator controllers are part of "legacy" systems that were included in the original construction of the building, and some were added later in the life of the building. Thus, each building may have different types of elevator controllers, each different elevator controller generating a different magnitude of a change-of-state voltage for a given event. For this reason, an elevator door monitoring system must frequently be custom-built so that its input modules or devices correspond with the elevators at matching built-in voltages and current types.

The use of relay switches and other input devices in conventional elevator door monitoring system presents several drawbacks. Having to custom-build each door monitoring system, as described above, is expensive and time-consuming. Additionally, the mechanical parts in the relays are vulnerable to failure that limit the life expectancy of the relay. Still further, relays are noisy when in operation. Furthermore, a system with a multitude of relays presents room for improvement, both in terms of power consumption and in physical size of the elevator door monitoring system.

SUMMARY

It is to be understood that this summary is not an extensive overview of the disclosure. This summary is exemplary and not restrictive, and it is intended to neither identify key or critical elements of the disclosure nor delineate the scope thereof. The sole purpose of this summary is to explain and exemplify certain concepts of the disclosure as an introduction to the following complete and extensive detailed description.

In an aspect of the present disclosure, an elevator door monitor can comprise a differential amplifier having an input and an output, the input configured to electrically communicate with a source configured to output one of a change-of-state voltage with respect to an elevator control parameter and a change-of-state voltage value with respect to the elevator control parameter, the differential amplifier configured to produce an output voltage correlating to a magnitude of one of the change-of-state voltage and the change-of-state voltage value; and a microcontroller in communication with the output of the differential amplifier, the microcontroller configured to convert the output voltage from the differential amplifier to a numeric value, compare the numeric value to a setting value, and responsive to a determination that the numeric value reaches a threshold associated with the setting value, send a signal to a to an output relay control module, the signal comprising one selected from the group of a "true" signal and a "false" signal. The elevator door monitor can thereby be adaptable to a range of change-of-state voltages output by the source.

In another aspect of the present disclosure, a method of monitoring an elevator door, can comprise the steps of receiving a change-of-state voltage from a source, the change-of-state voltage generated by the source upon the occurrence of an event associated with an elevator control parameter; generating a numeric value corresponding to a magnitude of the change-of-state voltage; comparing the numeric value to a setting value; and responsive to a determination that the numeric value reaches a threshold associated with the setting value, send a signal to an output relay control module, the signal comprising one selected from the group of a "true" signal and a "false" signal.

Various implementations described in the present disclosure can comprise additional systems, methods, features, and advantages, which may not necessarily be expressly disclosed herein but will be apparent to one of ordinary skill in the art upon examination of the following detailed description and accompanying drawings. It is intended that all such systems, methods, features, and advantages be included within the present disclosure and protected by the accompanying claims. The features and advantages of such implementations can be realized and obtained by means of the systems, methods, features particularly pointed out in the appended claims. These and other features will become more fully apparent from the following description and appended claims, or can be learned by the practice of such exemplary implementations as set forth hereinafter.

BRIEF DESCRIPTION OF THE DRAWINGS

The features and components of the following figures are illustrated to emphasize the general principles of the present disclosure. Corresponding features and components throughout the figures can be designated by matching reference characters for the sake of consistency and clarity.

DETAILED DESCRIPTION

Figure 1:
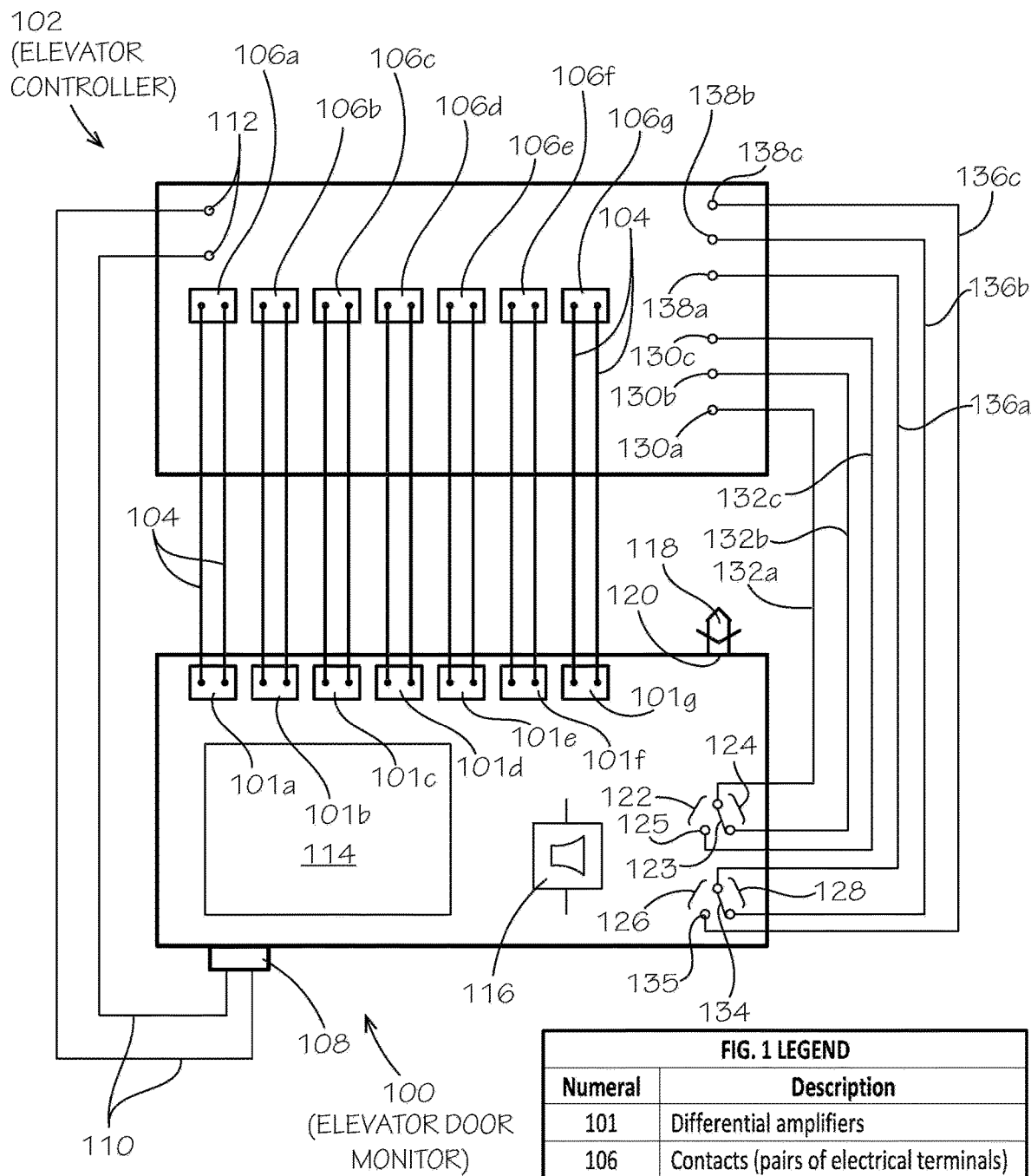
FIG. 1 is a schematic view of an elevator door monitor constructed in accordance with an aspect of the present disclosure, shown in relation to an elevator controller, with electrical connections extending between respective differential amplifiers of the elevator door monitor and corresponding contacts (pairs of electrical terminals) in the elevator controller.

The present disclosure can be understood more readily by reference to the following detailed description, examples, drawings, and claims, and their previous and following description. However, before the present devices, systems, and/or methods are disclosed and described, it is to be understood that this disclosure is not limited to the specific devices, systems, and/or methods disclosed unless otherwise specified, as such can, of course, vary. It is also to be understood that the terminology used herein is for the purpose of describing particular aspects only and is not intended to be limiting.

The following description is provided as an enabling teaching of the present devices, systems, and/or methods in their best, currently known aspect. To this end, those skilled in the relevant art will recognize and appreciate that many changes can be made to the various aspects described herein, while still obtaining the beneficial results of the present disclosure. It will also be apparent that some of the desired benefits of the present disclosure can be obtained by selecting some of the features of the present disclosure without utilizing other features. Accordingly, those who work in the art will recognize that many modifications and adaptations to the present disclosure are possible and can even be desirable in certain circumstances and are a part of the present disclosure. Thus, the following description is provided as illustrative of the principles of the present disclosure and not in limitation thereof.

Reference numerals common to more than one accompanying figure identify the same component throughout the figures.

As used throughout, the singular forms "a," "an" and "the" include plural referents unless the context clearly dictates otherwise. Thus, for example, reference to a quantity of one of a particular element can comprise two or more such elements unless the context indicates otherwise.

Ranges can be expressed herein as from "about" one particular value, and/or to "about" another particular value. When such a range is expressed, another aspect comprises from the one particular value and/or to the other particular value. Similarly, when values are expressed as approximations, by use of the antecedent "about" or substantially," it will be understood that the particular value forms another aspect. It will be further understood that the endpoints of each of the ranges are significant both in relation to the other endpoint, and independently of the other endpoint.

For purposes of the present disclosure, a material property or dimension measuring about X or substantially X on a particular measurement scale measures within a range between X plus an industry-standard upper tolerance for the specified measurement and X minus an industry-standard lower tolerance for the specified measurement. Because tolerances can vary between different materials, processes and between different models, the tolerance for a particular measurement of a particular component can fall within a range of tolerances.

As used herein, the terms "optional" or "optionally" mean that the subsequently described event or circumstance may or may not occur, and that the description comprises instances where said event or circumstance occurs and instances where it does not.

The word "or" as used herein means any one member of a particular list and also comprises any combination of members of that list.

To simplify the description of various elements disclosed herein, the conventions of "top," "bottom," "side," "upper," "lower," "horizontal," and/or "vertical" may be referenced. Unless stated otherwise, "top" describes that side of the system or component that is facing upward and "bottom" is that side of the system or component that is opposite or distal the top of the system or component and is facing downward. Unless stated otherwise, "side" describes that an end or direction of the system or component facing in horizontal direction. "Horizontal" or "horizontal orientation" describes that which is in a plane aligned with the horizon. "Vertical" or "vertical orientation" describes that which is in a plane that is angled at 90 degrees to the horizontal.

Disclosed is an elevator door monitor that eliminates the need to use customized input devices or modules (including but not limited to relays) in an elevator door monitoring system. Instead of customized input devices or modules, the disclosed elevator door monitor employs the use of "differential amplifier" circuits, one circuit for each signal to be monitored regarding an elevator car. In some implementations, anywhere from six (6) to ten (10) different signals may need to be monitored regarding the elevator car, each signal corresponding to a separate input into a microcontroller unit ("MCU"). Whereas each relay in a conventional system must frequently be configured differently to match different elevator change-of-state voltages and current types, all of the differential amplifier circuits of the elevator door monitor herein disclosed can be constructed identically. Each such circuit can accommodate a wide range of change-of-state voltages, one example range being 5V-300V, either AC or DC. Each differential amplifier circuit electrically communicates with a respective input terminal of the MCU, which can include a memory resource storing settings associated with respective elevator control parameters. Each setting can be a numeric value representing a magnitude of voltage (which can be expressed in units of $V_{rms}$) reached between selected contacts in the elevator controller when the elevator control parameter associated with the contacts undergoes a change of state.

A user can enter the setting for each MCU input terminal (i.e., each elevator control parameter) in various ways, one example of which can be via a small touchscreen display. Thus, the system of this invention can be constructed identically from one building to another. Customization is achieved through the settings input into the elevator door monitor via software, instead of using differing hardware components. This provides a universal system that can monitor doors of a variety of elevators without the drawbacks associated with an assembly of customized input devices or modules. These and other benefits are attendant to the elevator door monitor and method disclosed herein.

FIG. 1 is a schematic view of an elevator door monitor 100 constructed in accordance with an aspect of the present disclosure, shown in relation to a conventional elevator controller 102, with electrical connections 104 extending between respective differential amplifiers 101a-101g of the elevator door monitor 100 and corresponding contacts (pairs of electrical terminals) 106a-106g in the elevator controller 102. The differential amplifiers 101a-g can be constructed identically to one another and embody the circuitry discussed herein with regard to FIG. 18. As will be explained herein with reference to FIGS. 10-12, the elevator door monitor 100 can be powered with a battery. As shown in FIG. 1, the elevator door monitor 100, in some implementations, can be provided with a terminal pair 108 from which it receives power via lines 110 from power terminals 112 in the elevator controller 102. FIG. 1 also illustrates elements that, in some implementations, can be in communication with a microcontroller unit (MCU) (not shown, to be described herein with reference to FIG. 15), namely, a touch screen 114, a buzzer 116, and a wireless module 118 connected to a port (such as serial port) 120 in the elevator door monitor 100, said elements functioning in a manner to be described herein.

Figure 14A:
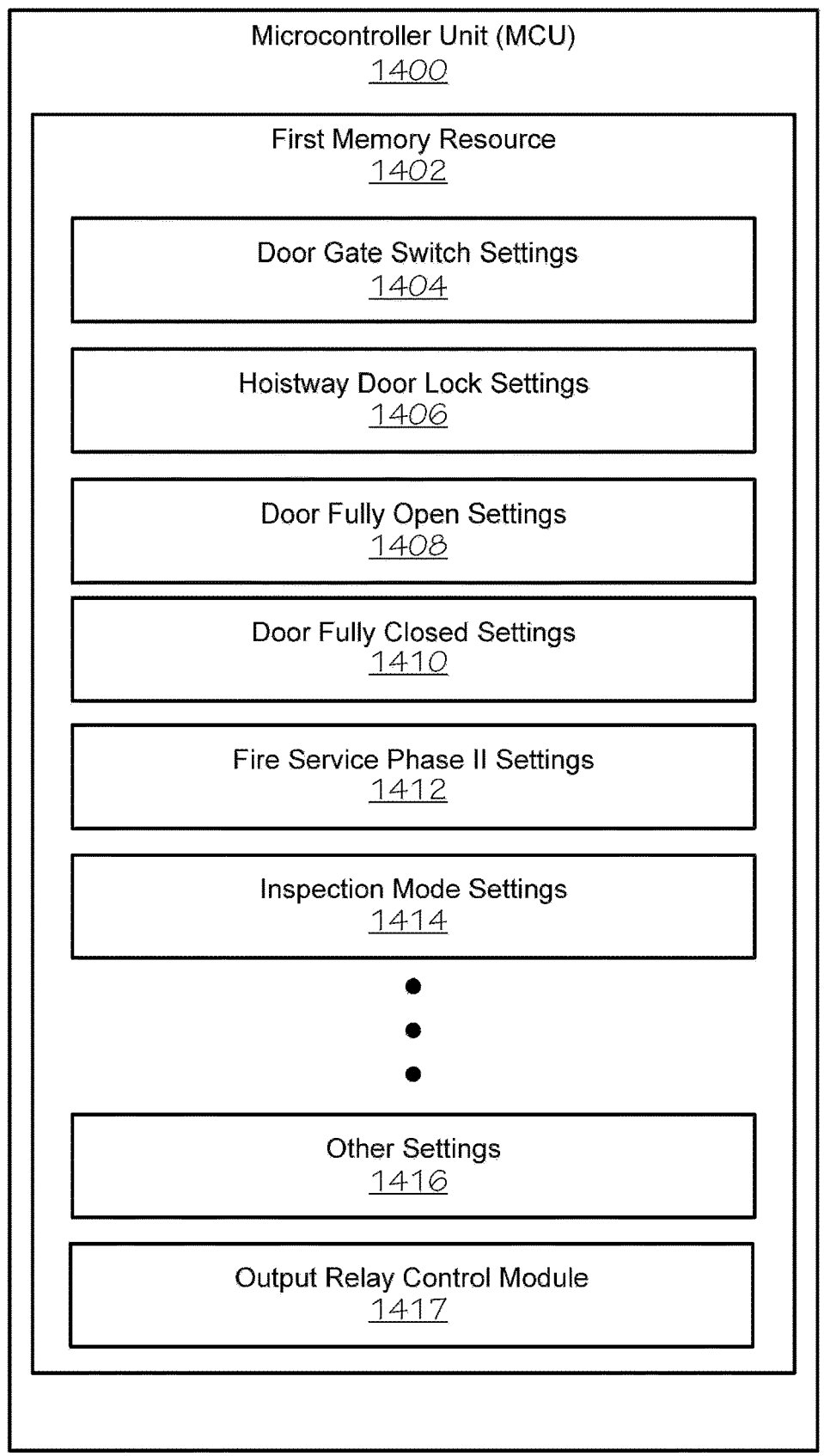
FIG. 14A is a block diagram of an exemplary microcontroller unit according to aspects of the present disclosure, in which a first memory resource is contained within the microcontroller unit, the memory resource storing an output relay control module as well as settings associated with various elevator control parameters.

Elevator door monitor 100 is also provided with output contacts, exemplified at 122, 124, 126, and 128. Switch 123 selectively electrically connects pairs of terminals (such as at 125), so as to close one of the contacts (such as 124) while leaving the other contact (such as 122) open. Thus, when switch 123 closes contact 124 (as shown), the elevator door monitor 100 sends an output signal via lines 132a,b to respective terminals 130a,b of the elevator controller 102. On the other hand, when switch 123 closes contact 122 (shown in FIG. 1 as open), the elevator door monitor 100 instead sends an output signal via lines 132a,c to respective terminals 130a,c of the elevator controller 102. Terminals 130a,b,c can be associated with an aspect of elevator control, such as motion of the elevator car door. Thus, the switch 123, when in the position illustrated in FIG. 1 (closing the contact 124), can result in an output signal being sent to the elevator controller 102 to allow the elevator car to move. In such an arrangement, if the switch 123 were to instead close contact 122, then such closure could instead result in the sending of an output signal to the elevator controller 102 allowing the elevator controller 102 to halt motion of the elevator car. Similarly, switch 134 selectively electrically connects pairs of terminals (such as at 135), so as to close one of the contacts (such as 128) while leaving the other contact (such as 126) open. Thus, when switch 134 closes contact 128 (as shown), the elevator door monitor 100 can send an output signal via lines 136$a,b$ to respective terminals 138$a,b$ of the elevator controller 102. On the other hand, when switch 134 closes contact 126 (shown in FIG. 1 as open), the elevator door monitor 100 instead sends an output signal via lines 136$a,c$ to respective terminals 138$a,c$ of the elevator controller 102. Such an arrangement can be directed to, for example, the opening and closing of the elevator car doors, such that when the switch 134 assumes one of the aforementioned positions, it allows the elevator controller 102 to open the doors, and when in the other of the aforementioned positions, switch 134 allows the elevator controller 102 to close the doors. Other implementations of elevator door monitor 100 contemplate additional sets of output contacts; for example, an additional set of contacts could control a light (such as an LED) display on the elevator controller 102, or activation of an audio alarm. The above discussion of the output contacts exemplified in FIG. 1 illustrates operation of output relays, to be discussed herein with regard to FIG. 10. The output relays are controlled as a result of a determination performed by an output relay control module 1417 (FIG. 14A), which comprises an algorithm (programming instructions) stored into a memory resource 1402 of a microcontroller unit (MCU) 1400 (FIG. 14A).

Each of the differential amplifiers 101$a$-$g$ can be dedicated to receiving a signal corresponding to just one specific elevator control parameter. The principal elevator control parameters discussed herein are described below with regard to each specific differential amplifier 101 and a corresponding specific elevator controller contact 106; however it is to be understood that such association is discussed only for purposes of illustration and that a physical position of a differential amplifier 101 in the elevator door monitor 100, or physical position of a contact 106 in the elevator controller 102, need not always be associated with a particular elevator control parameter. For instance, though the leftmost differential amplifier 101$a$ is associated with a "Door Fully Open" signal in the example below, that signal in other implementations could instead be associated with any of the other differential amplifiers 101$b$-$g$. It is also to be understood that each such signal can originate from a different contact 106 within the elevator controller 102. The physical location, within the elevator controller 102, of a contact 106 corresponding to a particular elevator control parameter is determined by knowing, based on schematics of the particular elevator controller 102 being used, where a voltage change between two electrical points can be measured at a time when a sensor signals a change of a state to the elevator controller 102. (This determination is discussed in greater detail with regard to the example provided in FIG. 2.) Also regarding the discussions of the parameters below, the sensors mentioned can be encoders (absolute and incremental), hall effect sensors, metal sensors, photoelectronic sensors, inductive sensors, RFID sensors, a camera, ultrasonic proximity sensors, a mechanical switch and laser-based sensors, though this exemplary list of types of sensors and switches is not intended to be limiting.

Door Fully Open ("DFO"): Differential Amplifier 101$a$, Contacts 106$a$.

This elevator control parameter can be detected by a sensor communicating with contacts 106$a$, such as an electromechanical switch with electrical contacts mounted on the elevator door in such a way that when the elevator car door is fully open the contacts are open, and closed otherwise. The sensor could also be, for example, a photosensor or a magnetic sensor. A DFO signal indicates whether the elevator car door is fully open. For example, the signal will be "true" if the elevator car door is fully open and "false" otherwise. A DFO signal is used, for example, to halt operation of a door-opening mechanism when the elevator door is fully open.

Door Fully Closed ("DFC"): Differential Amplifier 101$b$, Contacts 106$b$.

This elevator control parameter can be detected by a sensor communicating with contacts 106$b$, such as an electromechanical switch with electrical contacts mounted on the elevator door in such a way that when the elevator car door is fully closed the contacts are open, and closed otherwise. The sensor could also be, for example, a photosensor or a magnetic sensor. A DFC signal indicates whether the elevator car door is fully closed. For example, the signal will be "true" if the elevator car door is fully closed and "false" otherwise. A DFC signal is used, for example, to halt operation of a door-closing mechanism when the elevator door is fully closed.

Door Gate Switch ("DGS"): Differential Amplifier 101$c$, Contacts 106$c$.

Though listed in conjunction with the other elevator control parameters identified herein, DGS is a signal that is used for safety purposes, rather than elevator control purposes per se. Nevertheless, for purposes of the present disclosure, DGS shall be understood to be a type of "elevator control parameter," as that term is used herein. Instead of being concerned with door-opening and door-closing mechanisms (DFO and DFC, respectively), a DGS signal focuses upon the state of elevator car movement. Like DFC, this signal indicates whether the elevator car door is fully closed, and like DFC, will be "true" if the elevator car door is fully closed and "false" otherwise. Unlike DFC, however, a "false" DGS signal cuts power to the drive mechanism that moves the elevator car.

Hoistway Door Lock ("HDL"): Differential Amplifier 101$d$, Contacts 106$d$.

This elevator control parameter concerns landing doors instead of elevator doors. An HDL condition can be detected by a sensor communicating with contacts 106$d$, such as an electromechanical switch with electrical contacts mounted on a landing door in such a way that when the landing door is fully closed and locked, the contacts are closed (resulting in a "true" HDL signal), and open otherwise (resulting in a "false" HDL signal). Like a "false" DGS signal, a "false" HDL signal cuts power to the drive mechanism that moves the elevator car.

Fire Service Phase II ("FS2"): Differential Amplifier 101$e$, Contacts 106$e$.

In a Phase I condition, an elevator car travels to the lowest floor of a building for repair and/or maintenance. In that condition, the elevator does not react to a call from users. While elevator is in the Phase I condition, a fireman or repairman can activate a key switch inside the elevator. That activation brings it into Phase II. Such activation sends an indication that there is someone inside the elevator. The fireman or repairman has manual control over the elevator in the Phase II condition. That transition from a Phase I condition to a Phase II condition generates a measurable voltage across two points in the elevator controller 102 which, in some implementations, for example, can be a pair of electrical terminals driving an indicator lamp, if the particular type of the elevator controller 102 includes such a lamp. In other implementations, two such points could be two electrical terminals driving a relay coil that gets activated when the elevator controller transitions to Phase II. Other locations of measurable terminals can be possible with still other types of elevator controllers, and are contemplated as being within the scope of the present disclosure. An FS2 signal indicates whether the elevator car is in the Phase II condition ("true" signal), or not in that condition ("false" signal).

Inspection Mode: Differential Amplifier 101f, Contacts 106f.

Inspection mode is used by a member of a maintenance crew to perform repairs and/or maintenance of the elevator. An elevator car can be set to this mode in a variety of ways, such as a switch at the top of the elevator car, a key switch inside the elevator car, or a button in the elevator controller 102. An inspection mode signal indicates whether the elevator car is in inspection mode ("true" signal), or not in inspection mode ("false" signal).

Other Signals: Differential Amplifier 101g, Contacts 106g.

Differential amplifier 101g can be available to receive signals other than the elevator control parameters discussed above. For instance, contacts 106g may be those that generate a change-of-state voltage when the elevator controller 102 changes from an operational condition to a fault condition. In such implementations, an output signal from differential amplifier 101g can prompt the microcontroller (to be described herein) activate an alarm and/or, in some implementations, wirelessly send a communication to a user in a manner to be described with reference to FIG. 25.

Figure 2:
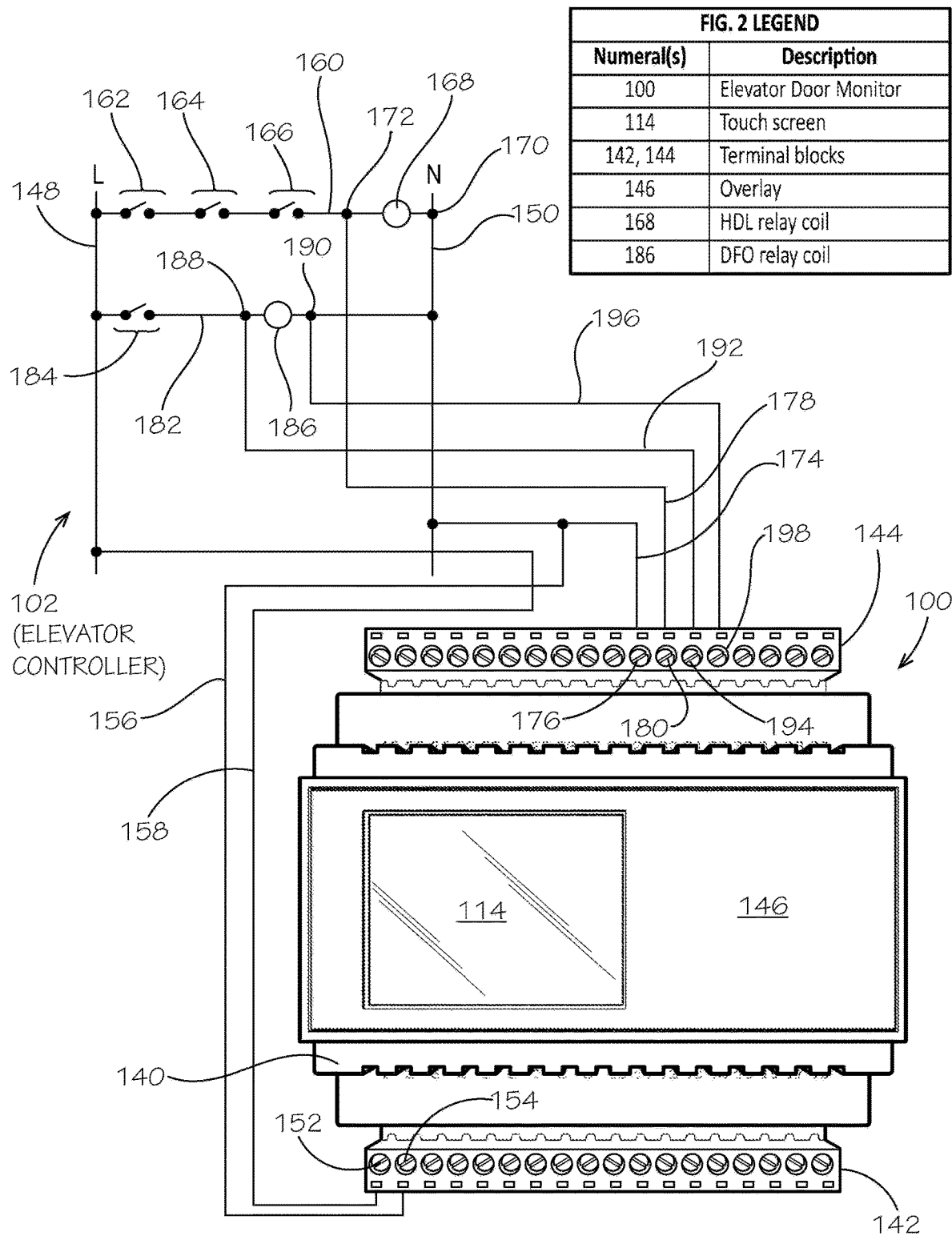
FIG. 2 is a schematic view isolating a subset of the connections between an elevator controller and the elevator door monitor illustrated in FIG. 1.
Figure 8:
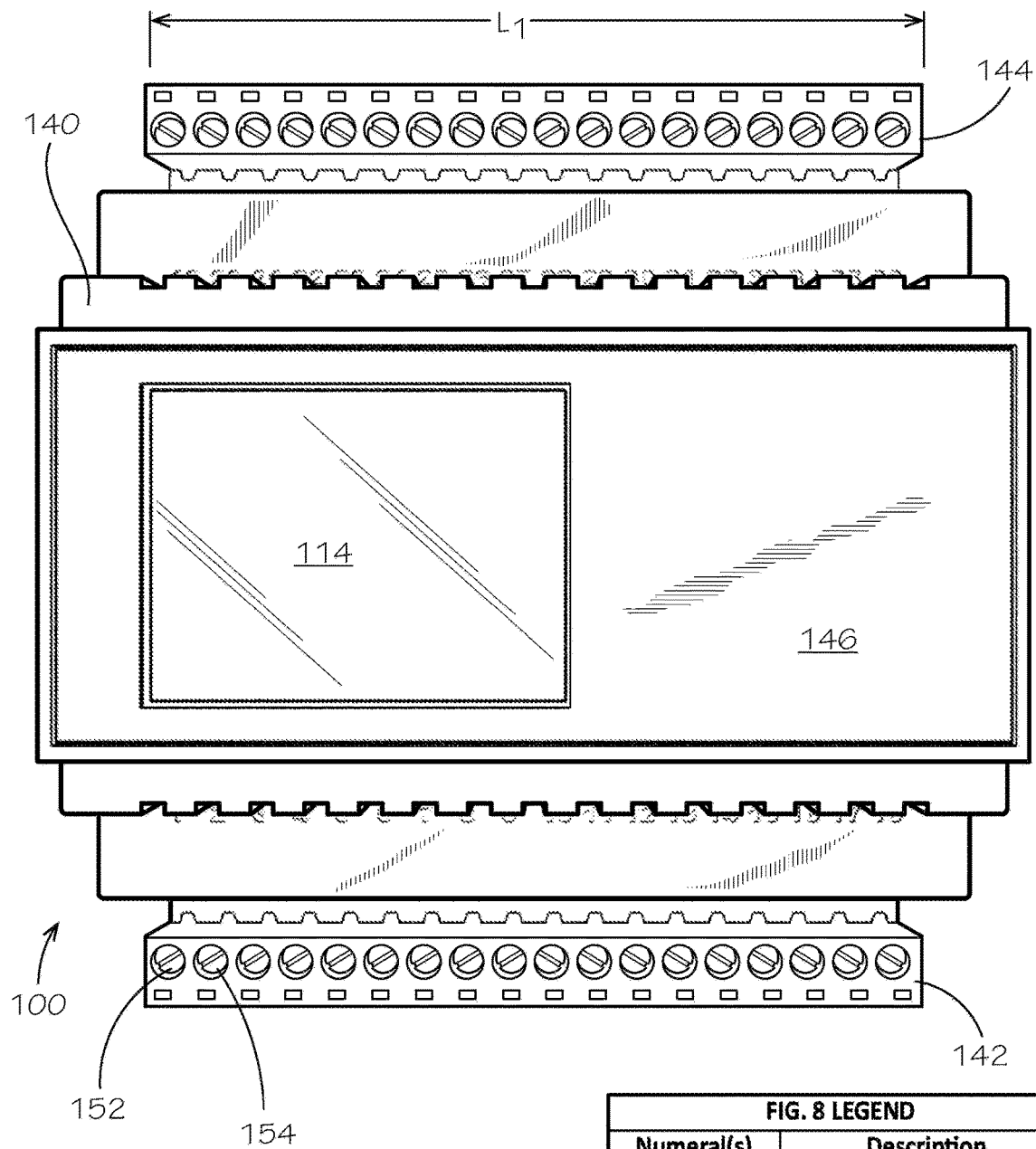
FIG. 8 is a top of the elevator door monitor illustrated in FIG. 1.

FIG. 2 is a schematic view isolating a subset of the connections between the elevator controller 102 and the elevator door monitor 100 illustrated in FIG. 1. The elevator door monitor 100 is shown in a top view, showing that the elevator door monitor 100 can comprise a housing 140, terminal blocks 142,144 extending outwardly with respect to the housing 140, and an overlay 146 positioned atop the housing 140 and touch screen 114. Terminal blocks 142,144 have a length $L_1$ (FIG. 8) that promotes the compactness of elevator door monitor 100. For example, $L_1$ can have a length ranging from 3 to 6 inches, and in one implementation can measure 4.1 inches. The elevator controller 102 is illustrated as a partial schematic, showing a line ("L") rail 148, which carries active voltage, and a neutral ("N") rail 150. Rails 148,150 are in communication with respective power connection inputs 152,154 in terminal block 142, via respective power lines 156,158. A hoistway door lock ("HDL") line 160 extends between rails 148,150 and is interrupted by a plurality of HDL contacts 162,164,166, one contact per each floor serviced by the associated elevator car. Three HDL contacts are shown for purposes of illustration only, it being understood that the elevator controller 102 can have differing numbers of HDL contacts, depending on the number of floors in the building so serviced. To find a magnitude of a voltage generated upon a change of state of one of the HDL contacts 162,164,166 from an open position to a closed position (and thus, the change of an HDL signal from "false" to "true"), or vice versa, for such an HDL contact, a user must find two points where a change in voltage can be measured as a corresponding such a change of state. One example would be measuring the voltage at an HDL relay coil 168, residing between terminals 170 and 172 (with terminal 170 residing on the neutral rail 150), when any one of the HDL contacts 162,164,166 undergoes a change of state of the type described above. Upon measurement of such a voltage when the HDL relay coil 168 gets active, it would be established that the occurrence of a voltage change equaling the measured magnitude corresponds to a change of state in HDL line 160, and thus the terminals 170,172 could be electrically connected to respective inputs of differential amplifier 101d (FIG. 1). Such electrical connection can be achieved by connecting terminal 170, via input signal connection line 174, to input terminal 176 in terminal block 144, and by connecting terminal 172, via input signal connection line 178, to input terminal 180 in the same terminal block 144.

Still referring to FIG. 2, another example of locating change-of-state voltage contacts in the elevator controller 102 is illustrated with regard to the Door Fully Open (DFO) parameter. A DFO line 182 extends between rails 148,150 and is interrupted by a DFO contact 184 (only one is shown for purpose of illustration, but additional such contacts should be understood to be present in actual implementations). Voltage at a DFO relay coil 186, residing between active terminals 188 and 190, can be measured when DFO contact 184 undergoes a change of state of the type described above. Upon measurement of such a voltage when the DFO relay coil 186 gets active, it would be established that the occurrence of a voltage change equaling the measured magnitude corresponds to a change of state in DFO line 182, and thus the terminals 188,190 could be electrically connected to respective inputs of differential amplifier 101a (FIG. 1). Such electrical connection can be achieved by connecting terminal 188, via input signal connection line 192, to input terminal 194 in terminal block 144, and by connecting terminal 190, via input signal connection line 196, to input terminal 198 in the same terminal block 144.

Figure 3:
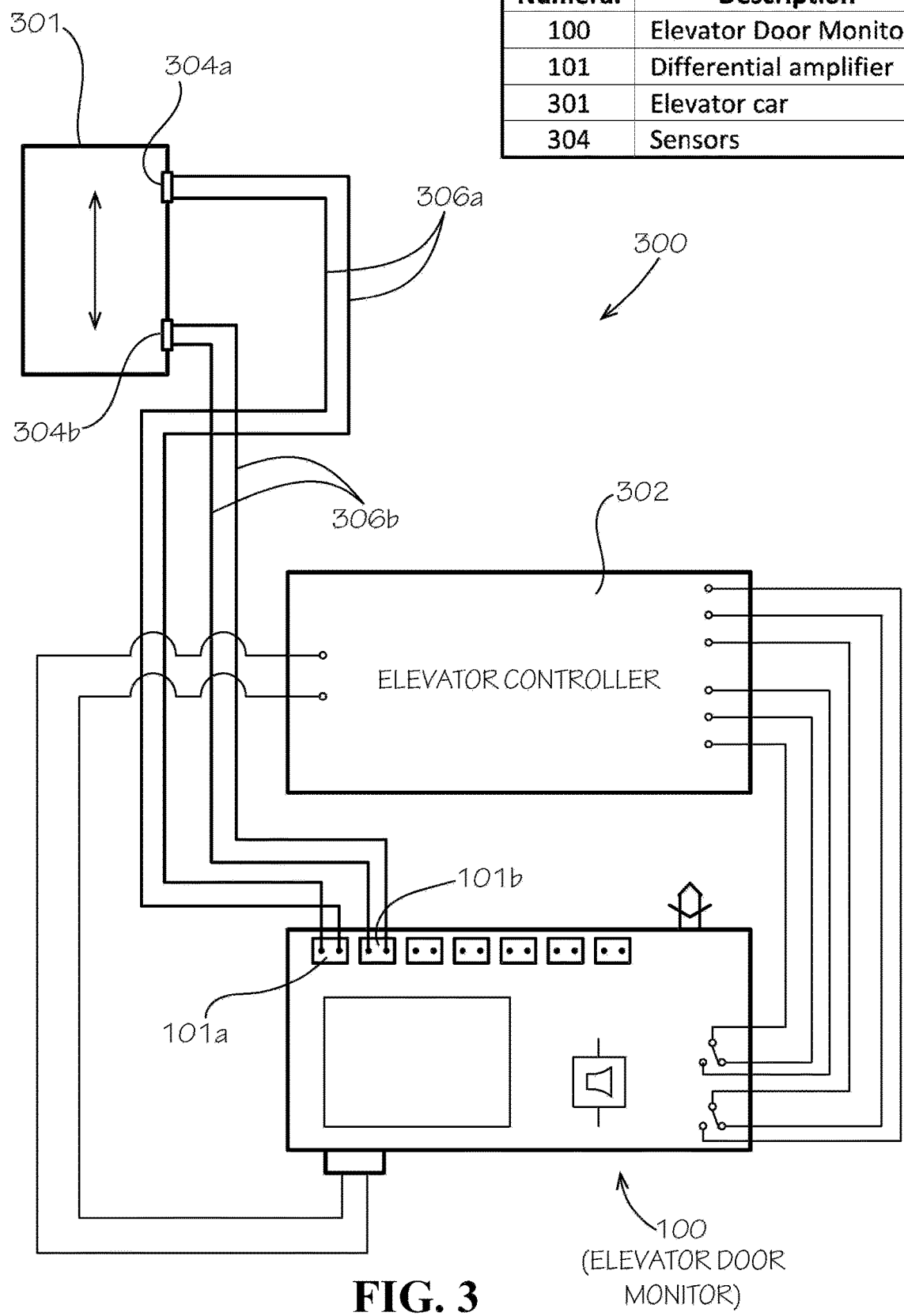
FIG. 3 is a schematic view of the elevator door monitor of FIG. 1, showing direct wired connections between the elevator door monitor and sensors attached to an elevator car.
Figure 4:
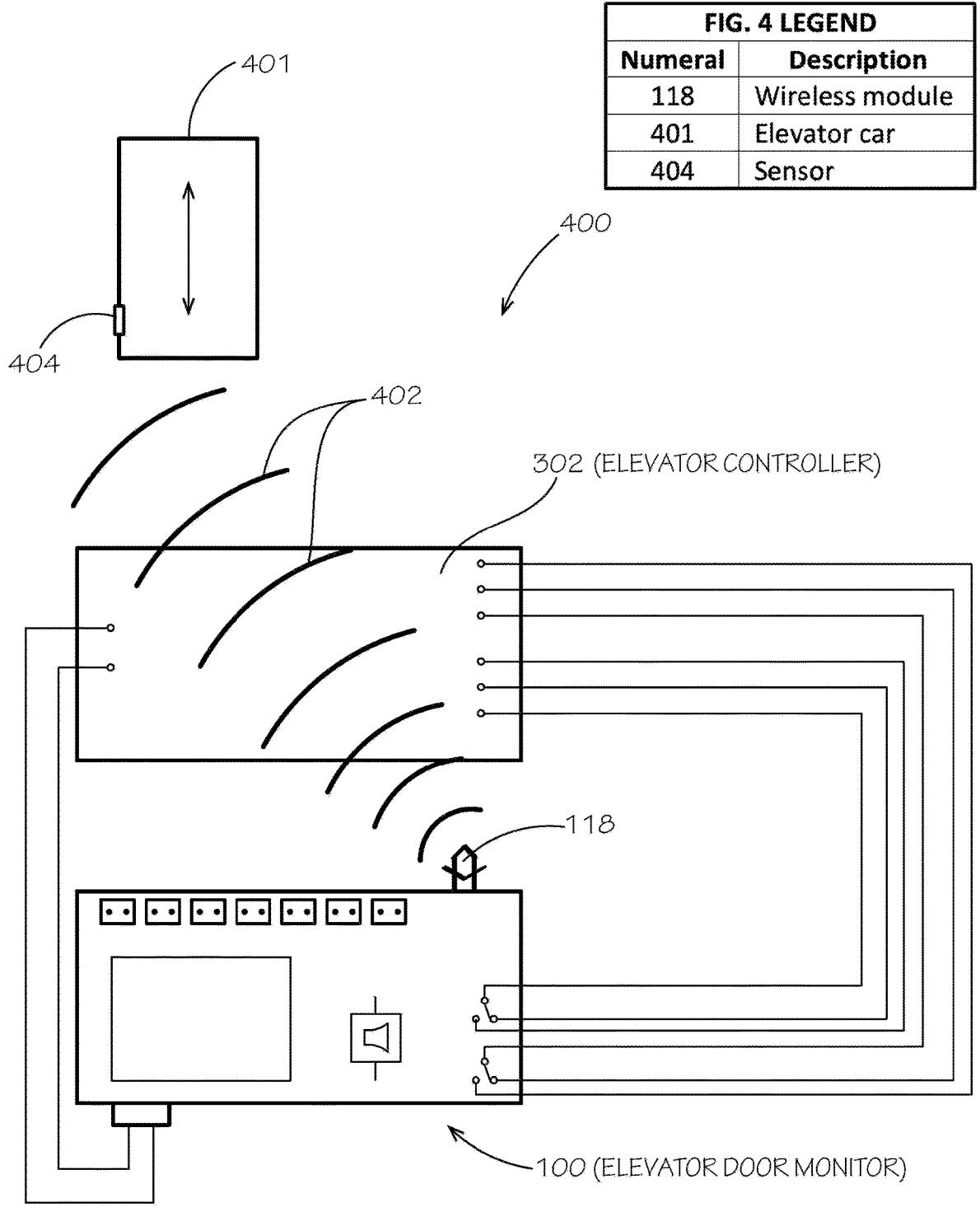
FIG. 4 is a schematic view of an elevator door monitor constructed of FIG. 1, showing direct wireless connection between the elevator door monitor and a sensor attached to an elevator car.

FIGS. 3 and 4 are schematic views of elevator door monitor 100, showing direct connections between the elevator door monitor 100 and sensors attached to an elevator car 301. Such arrangements can be used for an elevator controller 302 constructed differently than elevator controller 102, when for some reason it is not possible to ascertain two points within the elevator controller 302 for which a measured voltage difference can correspond to a change of state. FIG. 3 illustrates an environment 300 in which differential amplifiers such as 101a, 101b are connected to sensors 304a, 304b via wired electrical connections 306a, 306b, respectively. FIG. 4 illustrates an environment 400 in which a direct wireless connection 402 is established between the wireless module 118 of the elevator door monitor 100 and a sensor 404 attached to an elevator car 401. The sensors 304, 404 provide change-of-state voltage values. In the wireless arrangement of FIG. 4, the sensor 404 transmits the change-of-state voltage value directly to a microcontroller unit (MCU), such as MCU 1400 (FIGS. 14A and 15) via a wireless transceiver, using serial communication. Alternatively, the MCU could be of a type that also includes wireless transceiver.

FIGS. 5-11, 15, and 16 best illustrate the physical structure of elevator door monitor 100 and its components.

Figure 5:
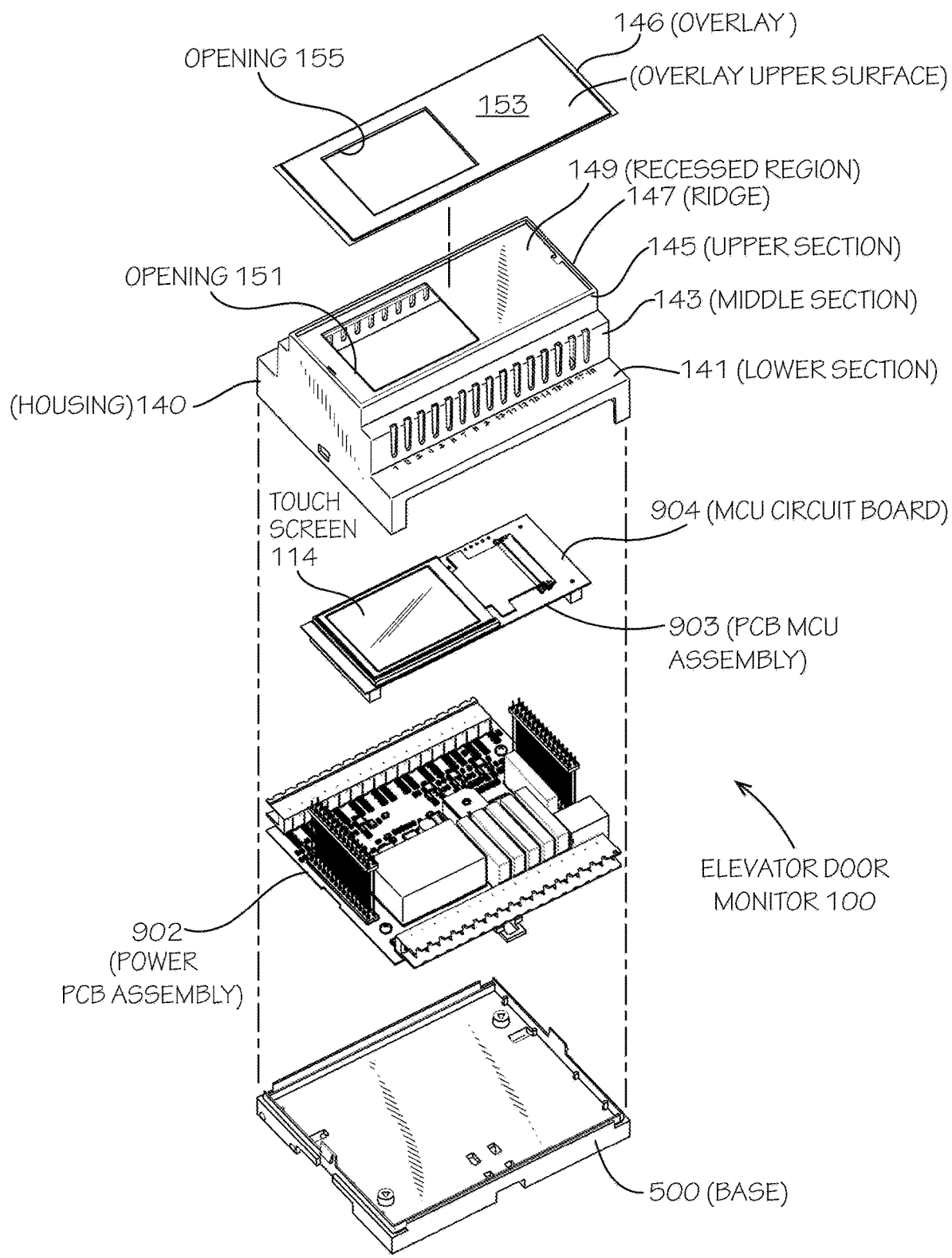
FIG. 5 is an exploded perspective view of the elevator door monitor illustrated in FIG. 1.
Figure 6:
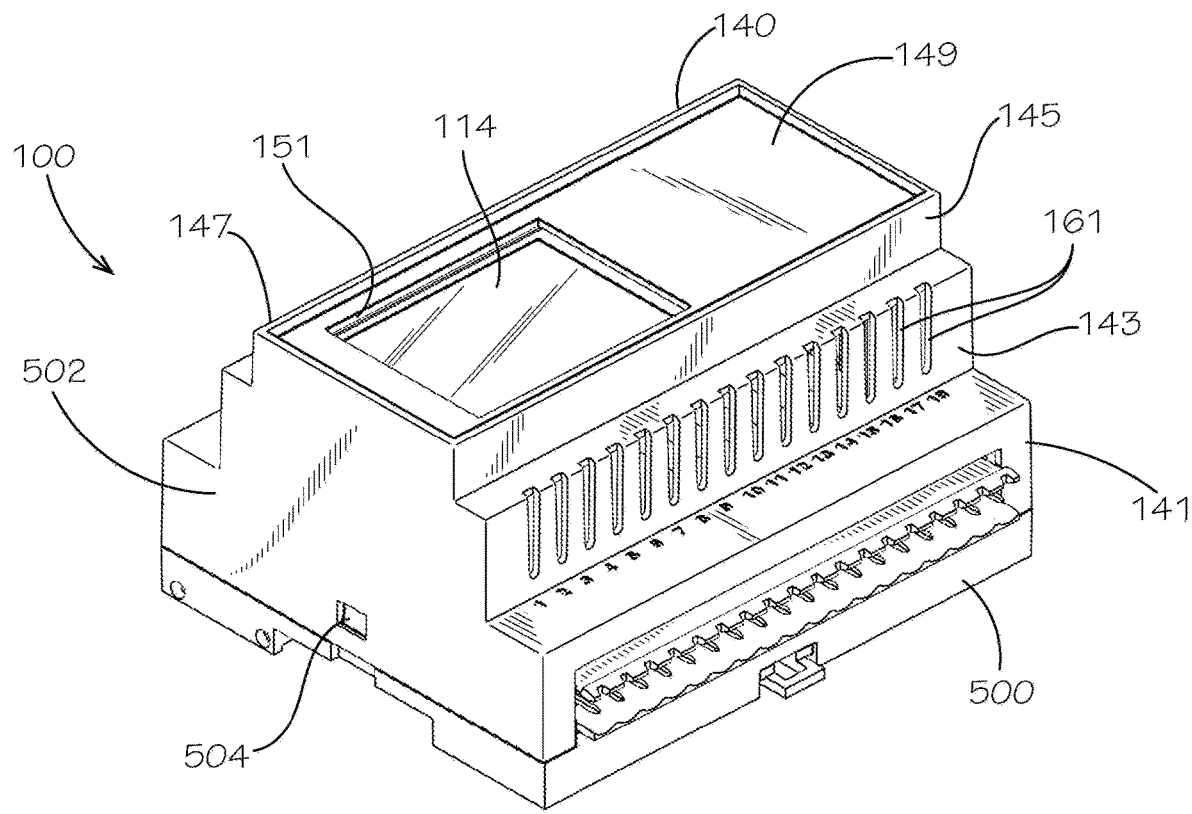
FIG. 6 is a right perspective view of the elevator door monitor illustrated in FIG. 1.
Figure 7:
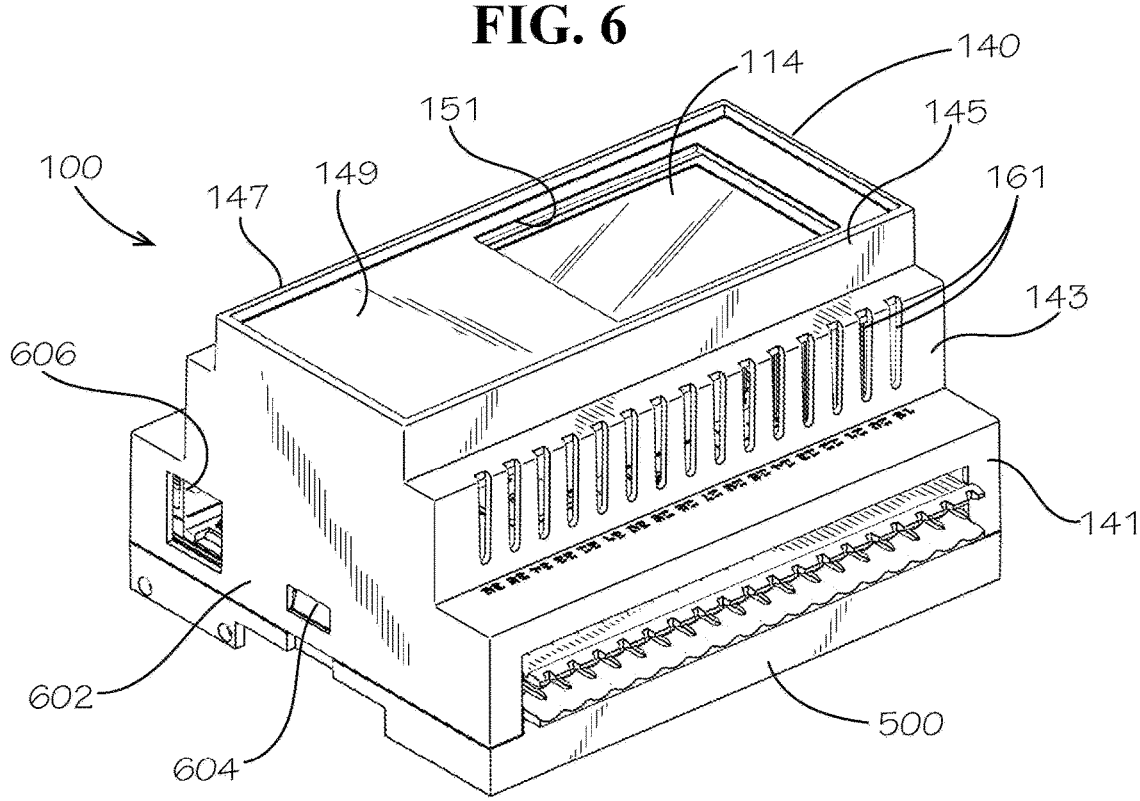
FIG. 7 is a left perspective view of the elevator door monitor illustrated in FIG. 1.
Figure 9:
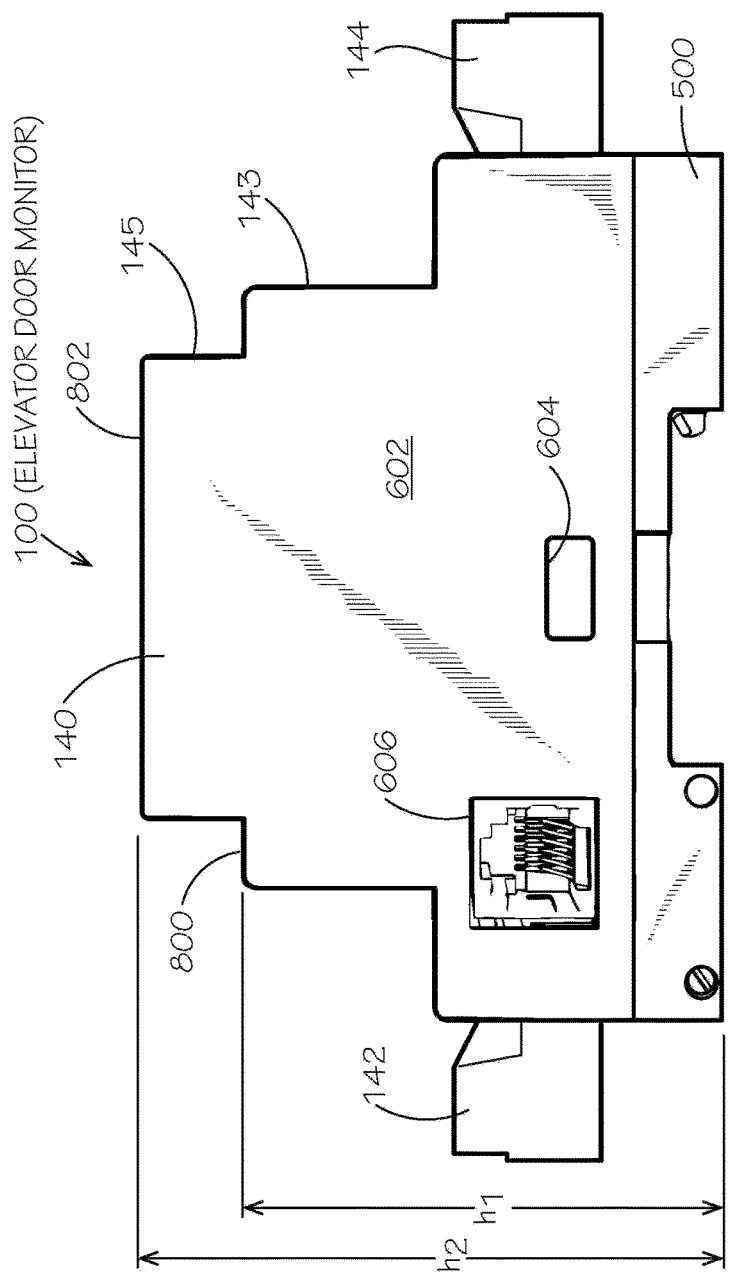
FIG. 9 is an end view of the elevator door monitor illustrated in FIG. 1.

Referring first to FIGS. 5-9, starting with the exploded view of FIG. 5, elevator door monitor 100 includes a base 500 upon which is mounted a power printed circuit board (PCB) assembly 902, a microcontroller unit (MCU) PCB assembly 903 assembled atop the power PCB assembly 902, the MCU PCB assembly 903 including an MCU circuit board 904, and the housing 140, which is also mounted to the base 500. Housing 140, which protects the assemblies 902,903 when the elevator door monitor 100 is in an assembled state, comprises a lower section 141, a stepped middle section 143 extending upwardly from the lower section 141, and a stepped upper section 145 extending upwardly from the stepped middle section 143. FIG. 5 shows all sections 141,143,145 joined together integrally as a single piece, though it is to be understood that housing 140 need not be limited to that type of construction. Upper section 145 terminates in a ridge 147 defining a periphery of the upper section 145. A recessed region 149 is sunken into the upper section 145 at an elevation lower than that of an upper surface of ridge 147. The recessed region 149 defines an opening 151 therein to permit touching and viewing of the touch screen 114 assembled onto the MCU circuit board 904 beneath the housing 140. The overlay 146 can optionally be received within the recessed region 149 such that the upper surface 153 of the overlay 146 can be substantially flush with the upper surface of ridge 147 when the overlay 146 is so assembled onto the housing 140. Upper surface 153 defines an opening 155 therein, which can be substantially coextensive with opening 151 in the recessed region 149 of the housing 140. Opening 155 likewise allows access to the touch screen 114. Stepped middle section 143 defines a plurality of ventilation openings 161 (FIGS. 6 and 7) to permit escape of any heat generated by the power PCB assembly 902 or the MCU PCB assembly 903. As seen in FIGS. 6 and 7, housing 140 defines a right end 502 and a left end 602. Right end 502 defines an opening 504 therein for the purpose of keeping the housing 140 attached to the base 500 through use of a self-locking mechanism. For the same purpose, left end 602 defines an opening 604 therein. Left end 602 also defines a port opening 606 therein to permit electrical connection between the elevator door monitor 100 and a compatible peripheral, such as a wireless sensor, a cellular modem, a personal computer, or a configuration device (module) that stores various settings and/or firmware for the elevator door monitor 100. Referring to FIG. 9, housing 140 can have height dimensions $h_1$ and $h_2$ that promote the compactness of elevator door monitor 100. For example, height $h_1$, measured from the bottom of base 500 to the top surface 800 of middle stepped section 143, can range from 1 to 4 inches, and in some implementations can measure 1.9 inches. For further example, height $h_2$, measured from the bottom of base 500 to the top surface 802 of ridge 147 (FIGS. 6 and 7), can range from 1.25 to 5 inches, and in one implementation can measure 2.25 inches.

Figure 10:
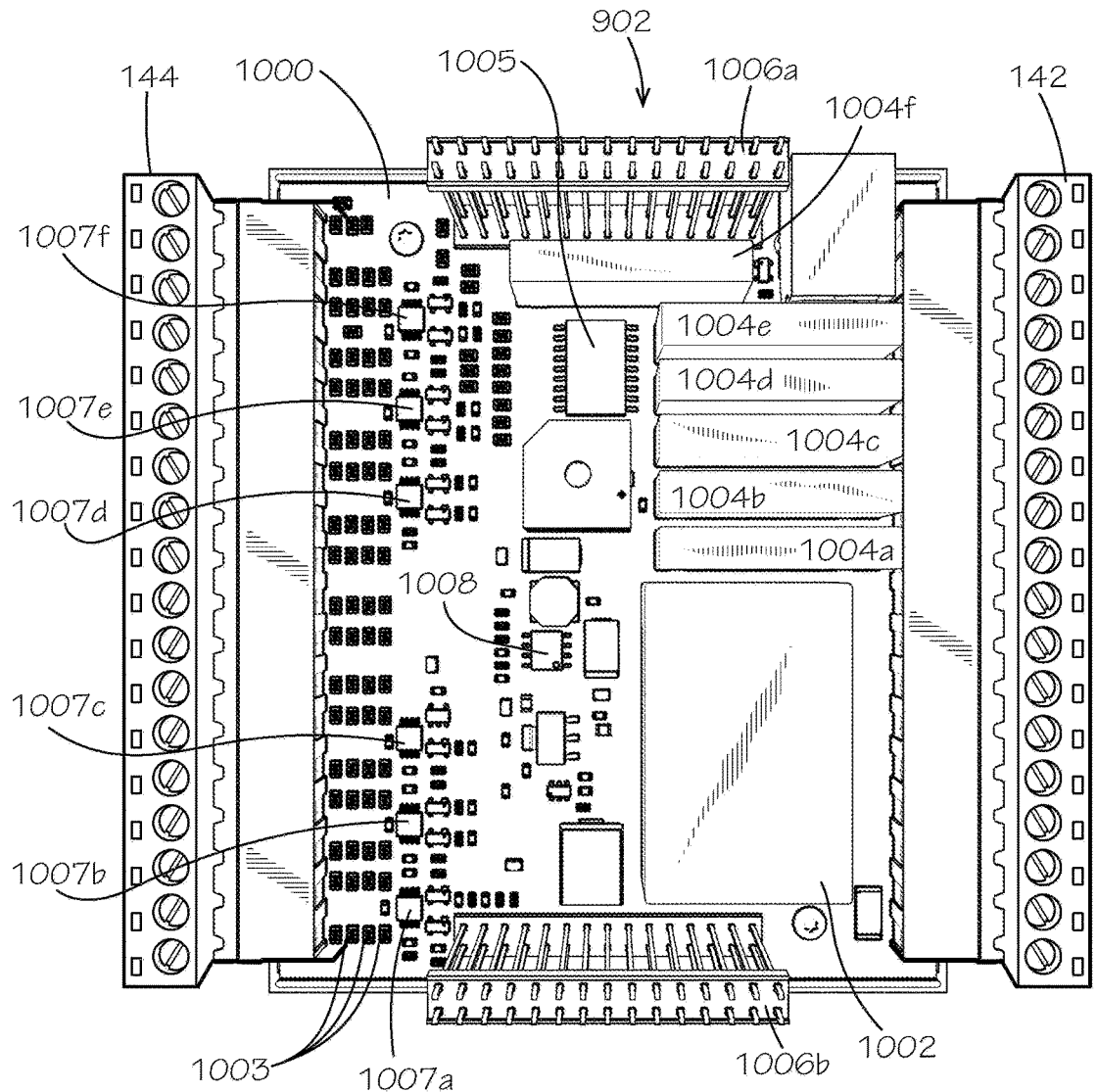
FIG. 10 is a top perspective view of the power printed circuit board and associated components illustrated in FIG. 5.
Figure 11:
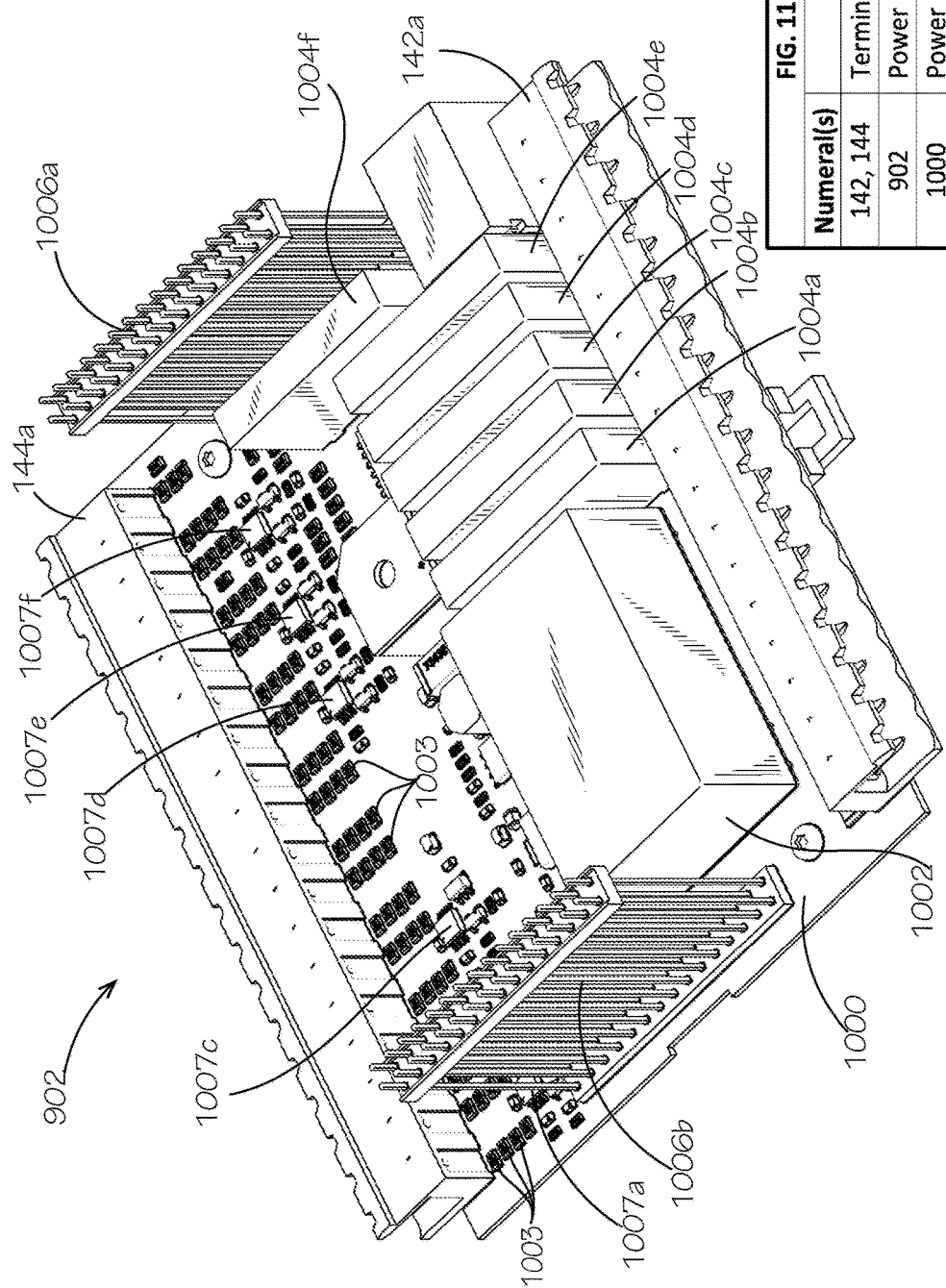
FIG. 11 is an isometric view of the power printed circuit board and associated components illustrated in FIG. 10.
Figure 12:
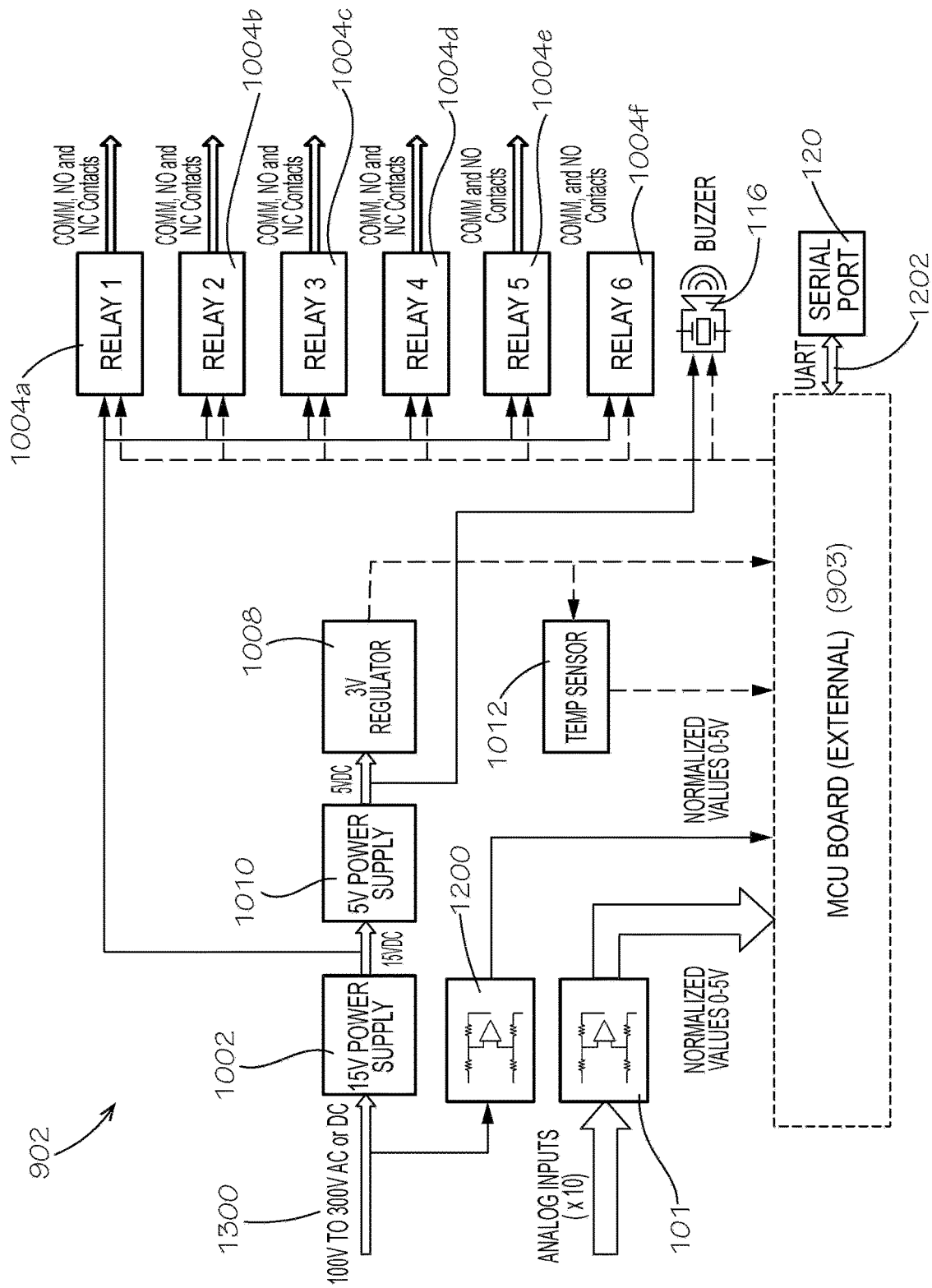
FIG. 12 is a block diagram illustrating the interconnections of components on the power printed circuit board illustrated in FIGS. 10 and 11.

FIGS. 10 and 11 illustrate the power circuit board assembly 902 in greater detail. FIG. 10 is a top perspective view of the power PCB assembly 902, and FIG. 11 is an isometric view of that assembly 902, differing slightly from FIG. 10 in that FIG. 11 shows only the outer casings 142a,144a of respective terminal blocks 142,144, for purposes of illustration. Power PCB assembly 902 includes a power PCB 1000 on which is are mounted several components, including operational amplifiers 1007a-1007f used in the differential amplifiers 101a-101f illustrated schematically in FIG. 1. (Not shown in FIGS. 10 and 11 is an operational amplifier corresponding to differential amplifier 101g of FIG. 1.) Various resistors 1003, mounted on the power PCB 1000, communicate with operational amplifiers 1007a-1007f to attenuate change-of-state voltages in a manner to be described below with regard to FIG. 18. Also mounted on the power PCB 1000 is a power supply 1002, which in some implementations can supply the power PCB assembly 902 with voltage ranging from 5V DC to 24V DC, such as 15V DC, and can include an analog-to-digital (ADC) converter to convert AC power to DC power. A plurality of output relays 1004a-1004f, which function in the manner described above with regard to the switches exemplified at 123 and 134 of FIG. 1, are mounted on the power PCB 1000. Output relays 1004a-1004f are standard relays that are commercially avail- able. One of these relays can be used to generate a signal that tells the elevator controller 102 whether the elevator door monitor 100 is functioning properly. The rest of the relays can be used by the elevator door monitor 100 to inform the elevator controller 102 of other situations, like an internal error or malfunction, as well as to program any custom logic that the customer might require or want to be implemented. The output relays 1004a-1004f are driven by a relay driver 1005 (FIG. 10) mounted to the power PCB 1000. The output relays 1004a-1004f are only an example of an interface between the elevator door monitor 100 and the elevator controller 102 (FIGS. 1 and 2). In other implementations, such an interface may take other forms, such as solid state digital outputs. Power PCB assembly 902 also includes power pole assemblies 1006a,1006b, which are mounted to power PCB 1000 and which electrically and mechanically interconnect power PCB assembly 902 and PCB MCU assembly 903 in the manner illustrated at FIG. 16. A voltage regulator 1008, mounted to power PCB 1000, communicates with power supply 1002 to reduce voltage entering PCB MCU assembly 903, as shown in FIG. 12. In some implementations, voltage regulator 1008 can be a commercially-available low drop voltage regulator.

Figure 13:
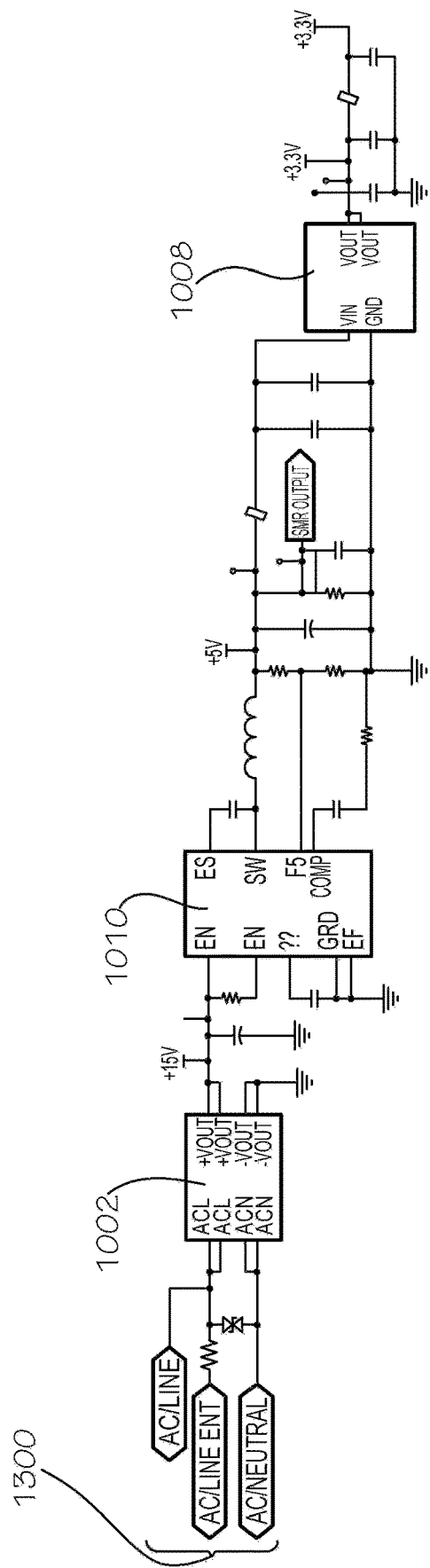
FIG. 13 is a schematic diagram illustrating components in the power supply portion of the power printed circuit board illustrated in FIGS. 10-12.

Referring to FIGS. 12 and 13, FIG. 12 is a block diagram illustrating the interconnections of components of the power PCB assembly 902, and FIG. 13 is a schematic diagram illustrating components in the power supply portion of power PCB assembly 902. Power supply 1002 is shown as receiving power from a power source 1300, which may be either AC or DC as shown in FIG. 12 but which in FIG. 13 is represented schematically as an AC power source 1300'. Power supply 1002 outputs a predefined DC voltage, which in some implementations can be the 15V DC shown, and which powers the output relays 1004. Next, for certain other components in the power PCB assembly 902, the power must be stepped down to a reduced predefined voltage, which in some implementations may be the 5V DC shown. A step-down voltage converter 1010, which communicates with power supply 1002, accomplishes that reduction and can be, in some implementations, a DC/DC buck converter. One component receiving the 5V DC output from the step-down voltage converter 101 is buzzer 116, which can sound an alarm if an invalid condition is present, or if there is a warning or internal malfunction. It is intended to give an audible notification of the status of the elevator control monitor 100 and to, if so configured by a user in the manner discussed herein with regard to FIG. 24H, provide a beep when touch screen 114 (FIGS. 5-7) is pressed. Buzzer 116 can be a component commercially available from known sources. As seen in FIG. 12, a voltage differential amplifier 1200, which can be constructed identically to differential amplifier 101a according to FIG. 18, attenuates voltage from source 1300 such that the voltage supplied to the PCB MCU assembly 903 is normalized to a predefined voltage range, such as the 0-5 V range recited in FIG. 12. That range is also output by the various differential amplifiers 101, represented schematically in FIG. 1, and supplied to the PCB MCU assembly 903. For certain other components in, or communicating with, the power PCB assembly 902, voltage must be reduced even further from the 5V provided by the step-down voltage converter 1010, and the voltage regular 1008 described above provides such further reduction and can, in some implementations receive the 5V output from the step-down voltage converter 1010 and reduce it to a predefined voltage such as 3.3V. The 3.3V is suitable to send to the MCU 1400 (FIG. 15) of the PCB MCU assembly 903 and further to certain components of the power PCB assembly 902 such as temperature sensor 1012, which can send an alarm if temperature within the elevator door monitor 100 exceeds a predefined threshold. Temperature sensor 1012 can be a sensor commercially available from known sources. Also shown in FIG. 12 is a Universal Asynchronous Receiver/Transmitter (UART) interface 1202, which allows two-way communication between any compatible device inserted into serial port 120 and the MCU of the PCB MCU assembly 903.

FIGS. 14A through 17 illustrate various aspects concerning the MCU PCB assembly 903.

Figure 15:
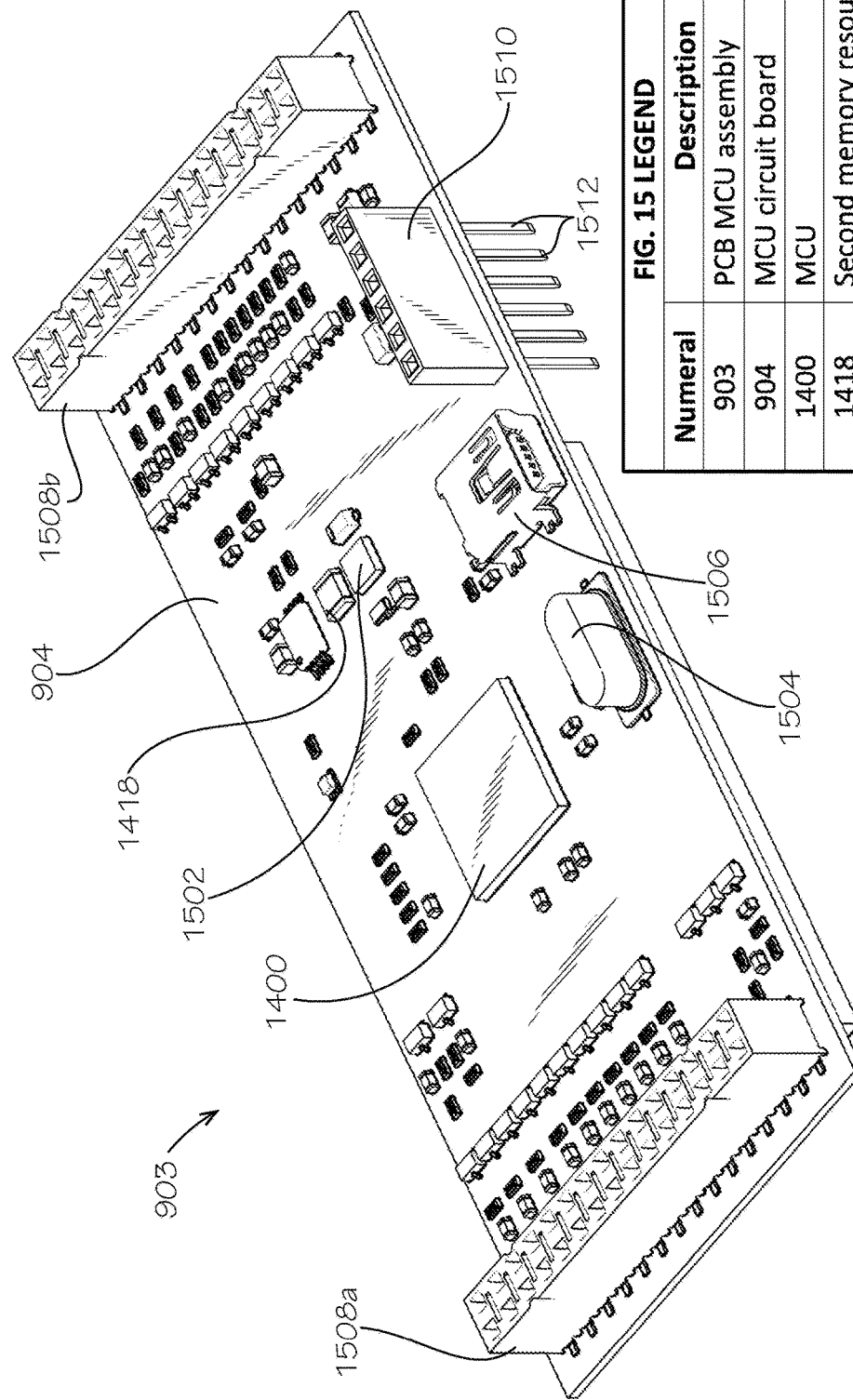
FIG. 15 is a perspective view of the bottom side of the microcontroller unit printed circuit board illustrated in FIG. 5.
Figure 16:
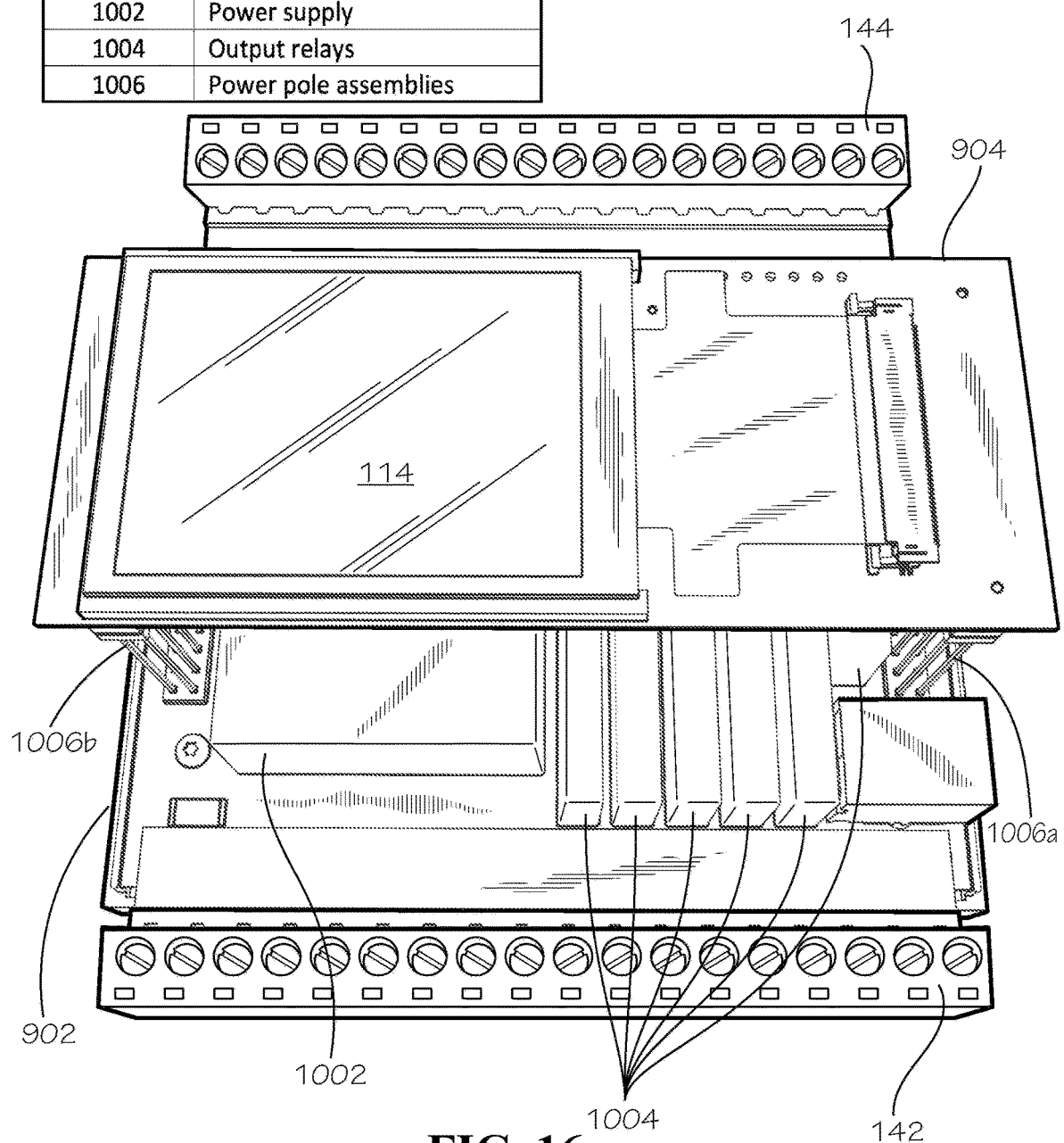
FIG. 16 is a top perspective view illustrating the microcontroller unit printed circuit board of FIG. 15 assembled onto the power printed circuit board of FIGS. 10-12.

Referring first to FIGS. 15 and 16, FIG. 15 is a perspective view of the bottom side of the MCU PCB assembly 903, and FIG. 16 is a top perspective view illustrating the MCU PCB assembly 903 assembled onto the power PCB assembly 902. The MCU PCB assembly 903 includes the MCU circuit board 904 and a microcontroller unit (MCU) 1400 mounted to the underside of the MCU circuit board 904. MCU 1400 can be, in some implementations, a 16-bit microcontroller and digital signal controller. As seen in the block diagram of FIG. 14A, such a MCU 1400 includes a first memory resource 1402, on which one can store the output relay control module 1417, which can be an algorithm (programming instructions) for controlling operation of the output relays 1004a-f (previously discussed with regard to FIGS. 10 and 11) or of other interface modules, the instructions causing the MCU 1400 to perform the techniques discussed above with regard to those output relays 1004a-f. One can also store, within first memory resource 1402 of MCU 1400, various settings with regard to the elevator control parameters discussed in greater detail below with regard to FIGS. 24A-24L, namely DGS settings 1404, HDL settings 1406, DFO settings 1408, DFC settings, FS2 settings 1412, and inspection mode settings 1414. FIG. 14A also shows that other settings 1416 can be stored in the first memory resource 1402. Examples of such other settings 1416 will be described herein with reference to FIG. 24H.

Referring again to FIG. 15, through various electrical connections on the MCU PCB 904, MCU 1400 communicates with several other components also mounted on the MCU PCB 904, including but not limited to a real-time clock (RTC) 1502, a crystal 1504, and a Uniform Serial Bus (USB) connector 1506. Crystal 1504 uses the MCU 1400 to generate its operating clock signal. USB connector 1506 can be used to electrically connect a variety of compatible peripherals to the MCU PCB assembly 903 once housing 140 is temporarily removed, including but not limited to a wireless sensor, a cellular modem, a personal computer, or a configuration device (module) that stores various settings and firmware for the elevator door monitor 100. FIG. 15 also illustrates a pair of power pole receptacle units 1508a, 1508b, each receptacle in those units being complementary to each of the power poles in the power pole assemblies 1006a,1006b (FIGS. 10 and 11). MCU PCB assembly 903 can be further provided with a connector 1510 having pins 1512 extending from the opposite side of MCU PCB 904. Connector 1510 is used for connecting to devices such as a personal computer or configuration device, for purposes of updating firmware, debugging, or programming software for the MCU 1400.

Also shown in FIG. 15 is a second memory resource 1418, mounted on the MCU PCB 904 and in communication with the MCU 1400. In some implementations, second memory resource 1418 can be a non-volatile memory (NVM) such as EERAM, which is an I2C static RAM (SRAM) with a shadow electrically erasable programmable read-only memory (EEPROM) backup. Second memory resource 1418 can also comprise other NVM types, such as read only memory (ROM), EEPROM, flash memory, and the like. Referring to the block diagram of FIG. 14B, second memory resource 1418 can store events history 1420, comprising information of the type to be discussed herein with regard to FIG. 24J. However, such events history 1420 need not be stored only in the second memory resource 1418. Events history 1420 can also, in other implementations, be stored in the first memory resource 1402 (FIG. 14A), either instead of, or in addition to, the second memory resource 1418. The second memory resource 1418 can also store other data 1422, which can comprise, for example, date and time information and device information (illustrated to FIGS. 24G and 24K, respectively, to be discussed herein).

Regarding the above discussions of the first memory resource 1402 and the second memory resource 1418, these storage units may be configured to store any combination of information, data, instructions, software code, etc. Computer-executable programming instructions such as the output relay control module 1417 (FIG. 14A) can be stored in one or more of the memory resources 1402,1418 and run on the same or different microprocessors and/or computer systems. Programming instructions can be stored in any computer-readable storage media for the non-transitory storage of information. For example, computer-readable storage media includes, but is not limited to NVM of the types discussed above with regard to second memory resource 1418, compact disc ROM ("CD-ROM"), digital versatile disk ("DVD"), high definition DVD ("HD-DVD"), BLU-RAY or other optical storage, magnetic cassettes, magnetic tape, magnetic disk storage, or other magnetic storage devices and the like.

Figure 17:
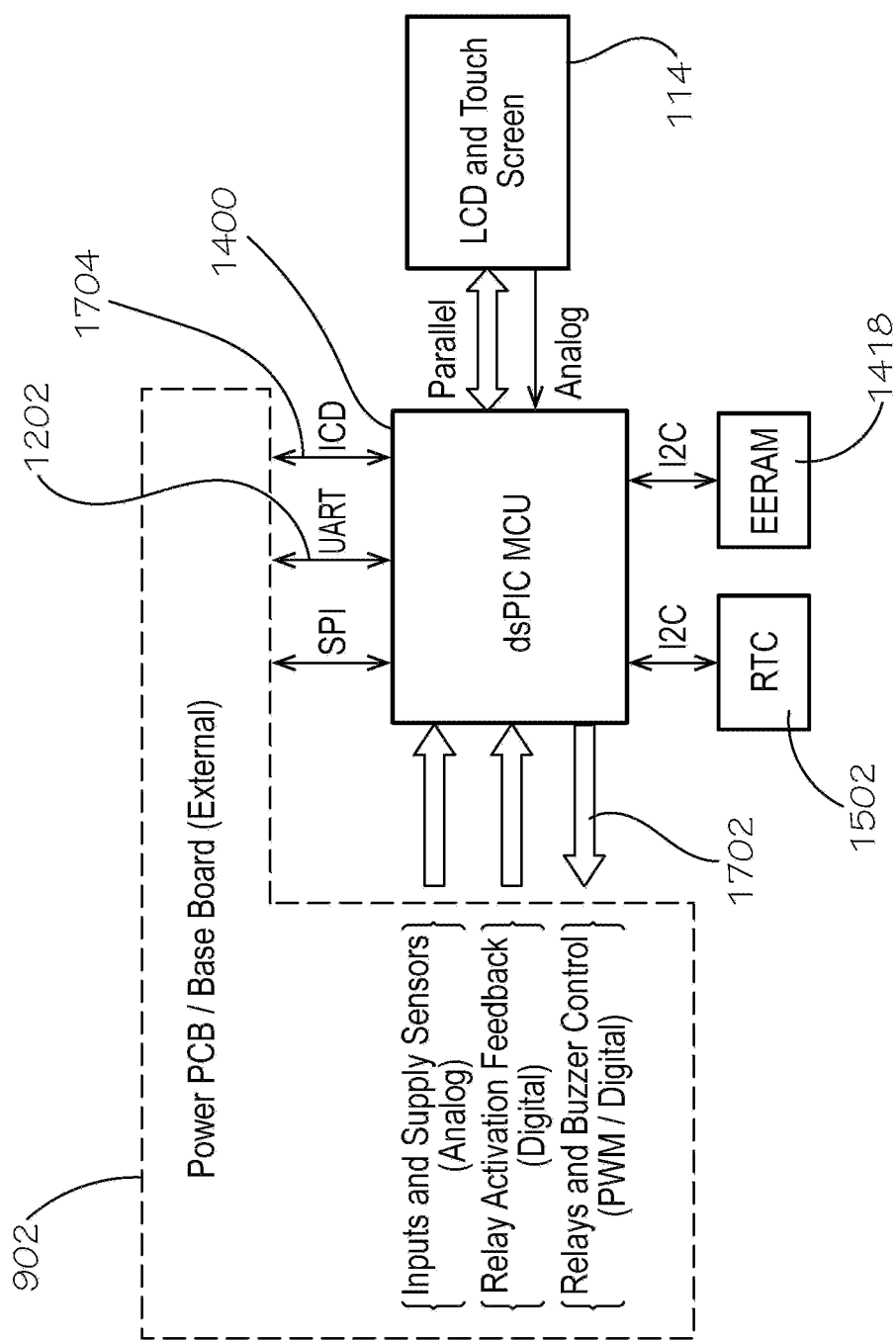
FIG. 17 is a block diagram illustrating exemplary interfaces between the microcontroller unit of the microcontroller unit printed circuit board of a memory unit, a real time clock, and an LCD and touch screen.

FIG. 17 is a block diagram illustrating exemplary interfaces between the MCU 1400 of the MCU PCB assembly 903, the second memory resource (EERAM) 1418, the RTC 1502, and the LCD and touch screen 114. In some implementations, touch screen 114 can be resistive touch screen with a color display. MCU 1400 is connected to the aforementioned components via the interfaces shown in FIG. 17. Interface 1702, which enables communication between the MCU 1400 and controls for the relays 1004 and buzzer 116 (FIG. 12) can, in some implementations, be a commercially-available analog interface. MCU 1400 can also be provided with an in-circuit debugger (ICD) 1704, which facilitates any needed debugging of firmware.

Figure 18:
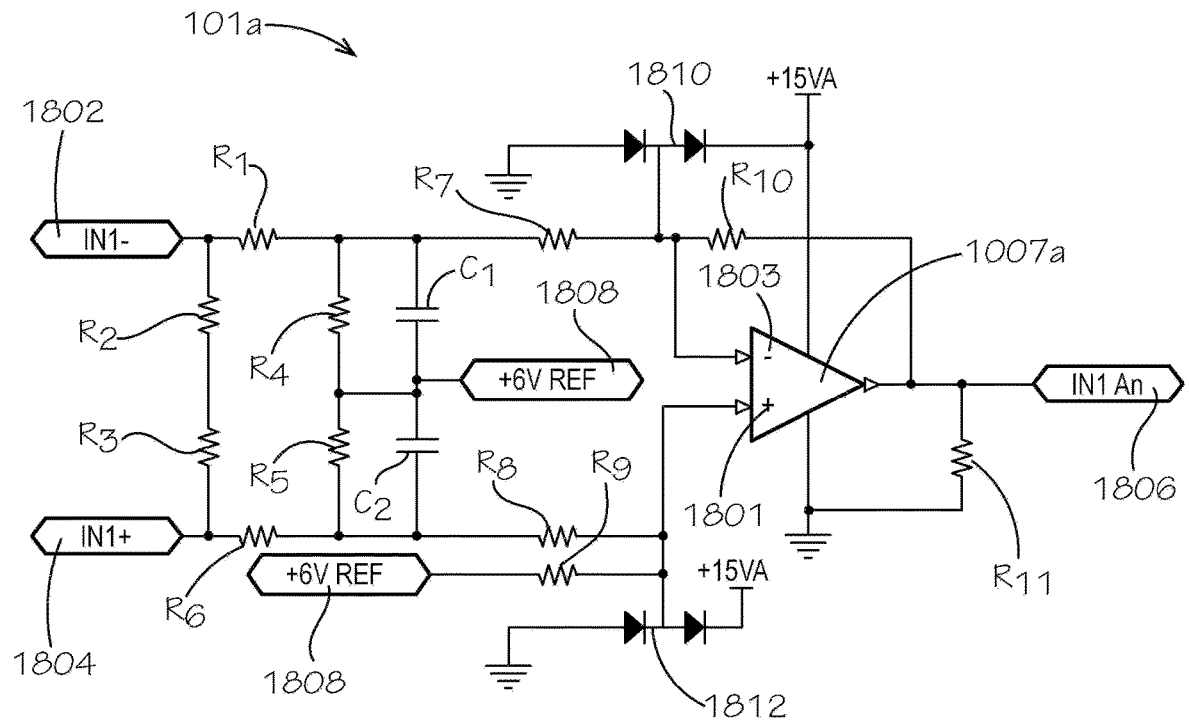
FIG. 18 is a schematic diagram detailing an exemplary differential amplifier used in an elevator door monitor constructed in accordance with an aspect of the present disclosure.

FIG. 18 is a schematic diagram detailing an exemplary differential amplifier 101a used in the elevator door monitor 100. As mentioned previously, the remaining differential amplifiers 101b-101f disclosed schematically in FIG. 1, as well as the power differential amplifier 1200 (FIG. 12), can be constructed identically to differential amplifier 101a according to FIG. 18. Differential amplifier 101a attenuates a change-of-state voltage received at input terminals 1802, 1804, and outputs the resulting attenuated voltage at output 1806, and thence to an input pin (not shown) of the MCU 1400. Differential amplifier 101a includes operational amplifier 1007a having the connections shown to resistors $R_1$-$R_{11}$, each of which corresponds to the resistors 1003 illustrated in FIGS. 10 and 11. Operational amplifier 1007a is provided with respective positive and negative terminals 1801,1803. The differential amplifier 101a attenuates the voltage at input terminals 1802,1804 through the illustrated resistor arrangement and the operational amplifier 1007a. Additionally, a reference voltage 1808, which in some implementations can be the 6V shown, can be implemented in order to center the voltage waveform about the midpoint of the positive and negative waveform amplitudes. In the exemplary arrangement of FIG. 18, regarding resistance values, $R_1=R_6$, $R_4=R_5$, $R_7=R_8$, and $R_9=R_{10}$. The various values for these resistances can be ascertained by those of skill in the art. Designating the input voltage at input terminals 1802,1804 as VI, and the reference voltage 1808 as $V_{REF}$, the output voltage $V_O$ can be calculated by the formula:

$$V_O = \left[V_I \times \left(\frac{R1}{R1+R4}\right) \times \left(\frac{R10}{R7}\right)\right] + V_{REF}$$

For situations in which the MCU 1400 cannot operate above Vo, then the attenuated voltage is further reduced by voltage dividers 1810,1812, each comprising the diode arrangements shown, each of which, in some implementations, can convert a signal range from 0-6V to 0.5-2.8V. The resulting voltage (denoted in the above example by "IN1 An") is output from the differential amplifier output 1806 and sent to the MCU 1400 for calculation as a numeric value.

Still referring to FIG. 18, elements of the differential amplifier 101a also perform low pass filtering. For input voltages that are AC-based, higher frequencies should be filtered out since they could affect subsequent calculations. Capacitors $C_1$ and $C_2$ can have equal capacitance values. Those capacitors, in combination with certain resistors connected in parallel to them, implement the low-pass filter. Specifically, the filter is formed by the combination of $R_1$ and $R_4$ in parallel to $C_1$, and the combination of $R_5$ and $R_6$ in parallel to C2.

Figure 19:
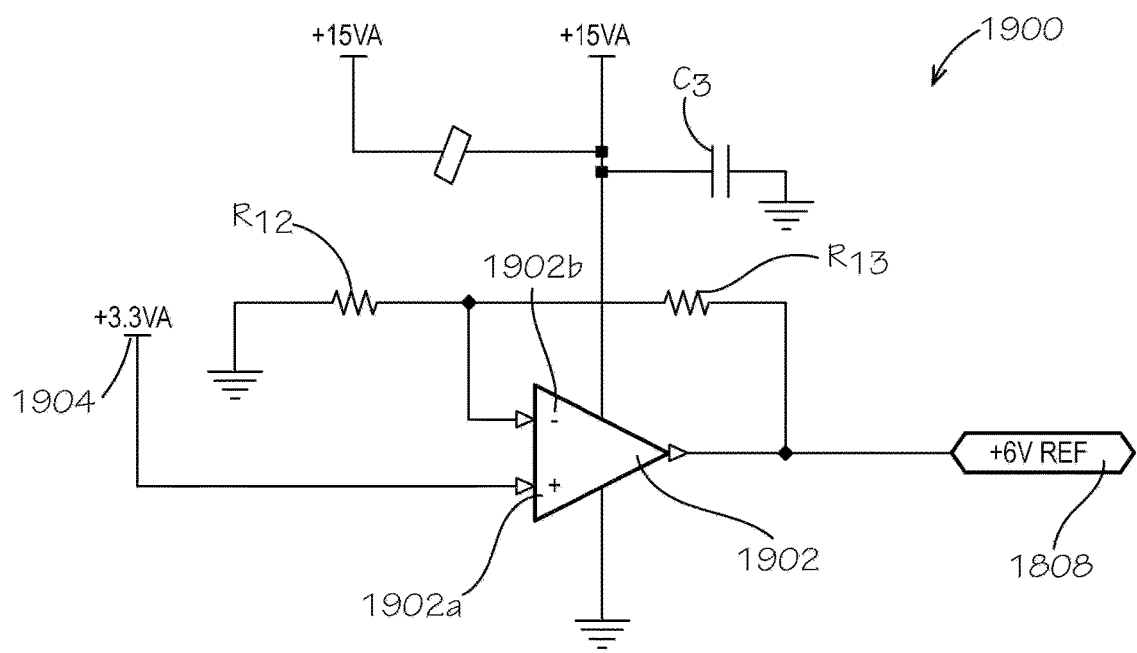
FIG. 19 is a schematic diagram detailing a circuit for supplying the reference voltage represented in FIG. 18.

FIG. 19 is a schematic diagram detailing a circuit 1900 for supplying the reference voltage represented in FIG. 18 at 1808. Circuit 1900 comprises an operational amplifier 1902, having a positive terminal 1902a and a negative terminal 1902b, connected as shown to resistors $R_{12}$ and $R_{13}$, and to capacitor $C_3$. Voltage from source 1904 enters the positive terminal 1902a of operational amplifier 1902. In some implementations, circuit 1900 effects the amplification of a source voltage of 6V to an output voltage of 3.3VA.

Figure 20:
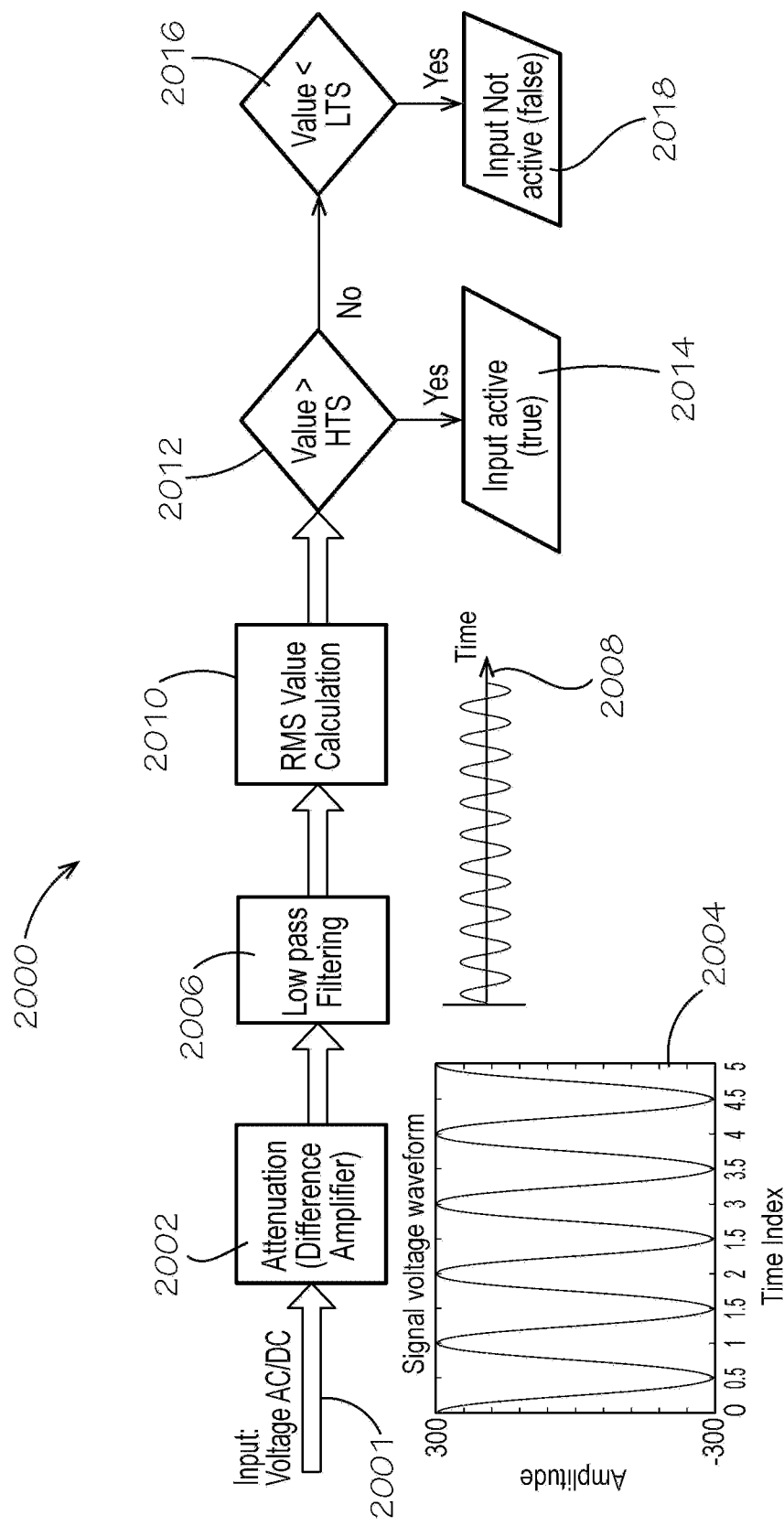
FIG. 20 is a flow chart illustrating processing steps executed by an elevator door monitor according to aspects of the present disclosure.

FIG. 20 is a flow chart illustrating a method 2000 executed by an elevator door monitor 100 according to aspects of the present disclosure. At block 2002, method 2000 begins with the attenuation of an input voltage 2001, i.e., a change-of-state voltage such as that which would be received from an elevator controller 102 in the arrangement of FIG. 1. The input voltage can have a signal voltage waveform as shown in the waveform diagram 2004 (which exhibits the maximum amplitude of 300V AC). The attenuation at block 2002 is performed using the techniques described above with regard to FIG. 18. Next, at block 2006, the attenuated voltage can undergo low pass filtering, also due to the circuit elements described above with regard to FIG. 18. An example of a resulting filtered waveform is illustrated in the waveform diagram 2008.

Still referring to FIG. 20, at block 2010, the filtered waveform enters MCU 1400 (FIGS. 15 and 17) and is there converted from a voltage signal to a numeric value. In some implementations, the MCU 1400 may calculate a root-mean-square ("RMS") value using the known formula:

The rms value of a set of n values for (x1, x2, . . . xn) is given by $$x_{rms} = \sqrt{\frac{1}{n}(x_1^2 + x_2^2 + \ldots + x_n^2)}$$

The "x" values underneath the radical represent voltage readings of any waveform at the MCU input. In instances where an input voltage already represents an RMS value, the MCU will merely perform an ADC conversion of the signal. Note that while determination of a numeric value has been described with regard to the RMS value calculation above, other methods of converting a voltage waveform to a numeric value are contemplated as being within the scope of the present disclosure. Programming stored in the first memory resource 1402 (FIG. 14A) of the MCU 1400 enables the MCU 1400 to correlate the numeric value (such as a $V_{rms}$ value) determined at block 2012 to the actual change-of-state (input) voltage 2001.

Figure 21:
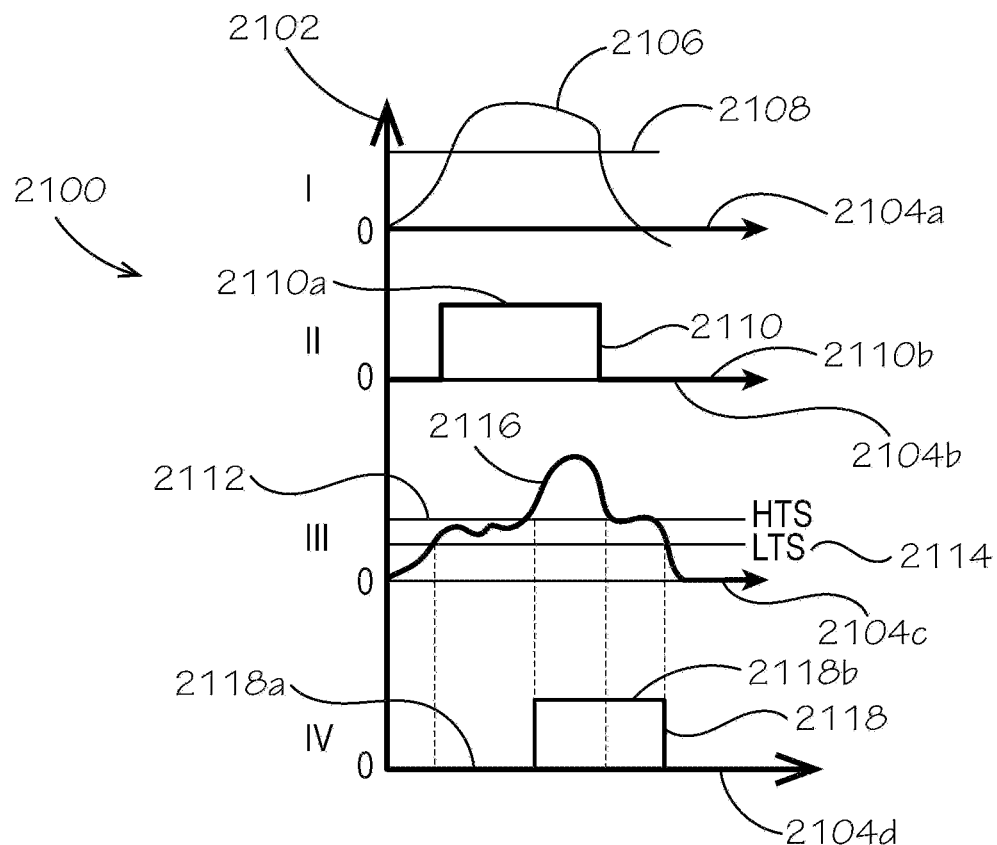
FIG. 21 is a series of graphs, I and II of which respectively represent theoretical analog and theoretical digital voltage outputs associated with a change of state of a signal without consideration of hysteresis thresholds, and III and IV of which respectively represent such analog and digital voltage outputs with hysteresis thresholds implemented according to aspects of the present disclosure.

The next steps in FIG. 20 are described in conjunction with FIG. 21, which is a series of graphs 2100, I and II of which respectively represent theoretical analog and theoretical digital voltage outputs associated with a change of state of a signal without consideration of hysteresis thresholds, and III and IV of which respectively represent such analog and digital voltage outputs with hysteresis thresholds implemented according to aspects of the present disclosure. Blocks 2012-2018 of FIG. 20 represent steps performed when the elevator door monitor 100 is configured to operate in an "active high" setting. At blocks 2012 and 2016, the correlated numeric value calculated at block 2010 is compared to a setting value, one example of which is a threshold voltage corresponding to a particular elevator control parameter, as described below with reference to FIGS. 24D and 24E. Other examples of setting values will become apparent upon a review of those and other figures to be described herein. Generally described with reference to both blocks 2014 and 2018, responsive to a determination that the numeric value reaches a threshold associated with the setting value, a signal is sent to the output relay control module 1417 (FIG. 14A), the signal comprising one selected from the group of a "true" signal and a "false" signal. The concept of a "threshold" in the context of the present disclosure is best understood with reference to FIG. 21, which comprises a series 2100 of plots or graphs, I-IV, each graph plotting voltage amplitude (axis 2102) versus time (axes 2104a-2104d). Without taking hysteresis into account, then whenever an analog voltage waveform 2106 (Graph I) exceeds a threshold 2108, the MCU 1400 would output a digital signal 2110 (Graph II) that would switch from a "true" signal level 2110a down to a "false" level 2110b the moment that the analog voltage waveform 2106 drops below the threshold 2108. This would result in unwanted frequent back-and-forth toggling between "true" and "false" signals when the waveform 2106 fluctuates proximate the threshold 2108. To prevent such unwanted frequency of toggling, the door elevator monitor 100 implements use of a high threshold setting 2112 ("HTS" in Graph III) and a low threshold setting 2114 ("LTS" in Graph III). Using the HTS and LTS values exemplified in FIGS. 24D and 24E, HTS could be 66% of the value of the threshold 2108, while LTS could be 33% of the value of the threshold 2108. Thus, when the analog waveform 2116 in Graph III has an amplitude less than the LTS 2114, the reactive digital signal 2118 (Graph IV) remains at a "false" level 2118a but becomes a "true" signal 2118b once the analog waveform 2116 crosses the HTS 2112. Digital signal 2118 remains at the "true" level 2118b even after the amplitude of the analog waveform 2116 drops below HTS 2112. Only when the amplitude of the analog waveform 2116 drops below the LTS 2114 will the digital signal 2118 return to the "false" level 2118a. In this manner, rapid toggling between "true" and "false" states is avoided.

Referring again to FIG. 20, block 2012 represents a determination that the numeric value equals or exceeds the HTS 2112 (FIG. 21) for the particular type of control parameter signal being monitored. In response, the MCU 1400, at block 2014, sends a "true" signal to the output relay control module 1417 (FIG. 14A). If, however, the MCU determines at 2016 that the numeric value is less than the LTS 2114 (FIG. 21), it sends, at block 2018, a "false" signal to the output relay control module 1417 (FIG. 14A). But, as described above, and as indicated by the "No" line extending between blocks 2016 and 2014, a "true" signal status is maintained even if the numeric value of analog waveform 2116 is less than the HTS 2112, so long as that value is still greater than the LTS 2114. If the elevator control monitor 100 operates in an "active low" setting, then blocks 2014 and 2018 would be switched in method 2000. In other words, at the "active low" setting, the MCU 1400 sends a "true" signal to the output relay control module 1417 when the numeric value is less than the LTS 2114, and sends a "false" signal to the output relay control module 1417 when the numeric value equals or exceeds the HTS 2112.

Figure 22:
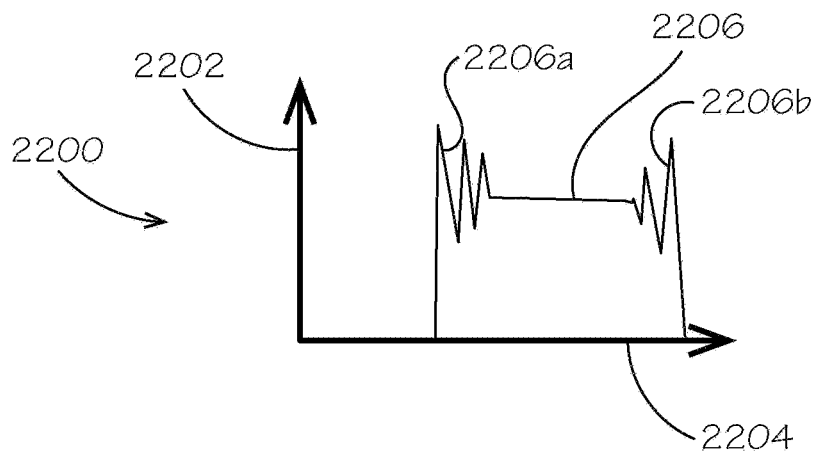
FIG. 22 is a graph similar to graph IV in FIG. 21, except showing bouncing controlled through implementation of de-bouncing delays.

FIG. 22 is a graph 2200 similar to Graph IV in FIG. 21, except showing bouncing controlled through implementation of de-bouncing delays. Graph 2200, which is a plot of amplitude 2202 versus time 2204 undergone by a digital signal 2206, presents a more realistic plot of a digital signal than the plot 2118 in Graph IV of FIG. 21, because in actuality, transitions from a "false" level to a "true" level, and vice versa, do not necessarily assume the sharp-cornered profile of Graph IV. Instead, signals frequently exhibit "bouncing," illustrated graphically at sawtoothed regions 2206a,2206b. According to some implementations, the elevator door monitor 100 should be understood to include methods and components to de-bounce the digital signal from the MCU 1400, to bring it closer to the ideal profile of Graph IV at 2118.

Figure 23:
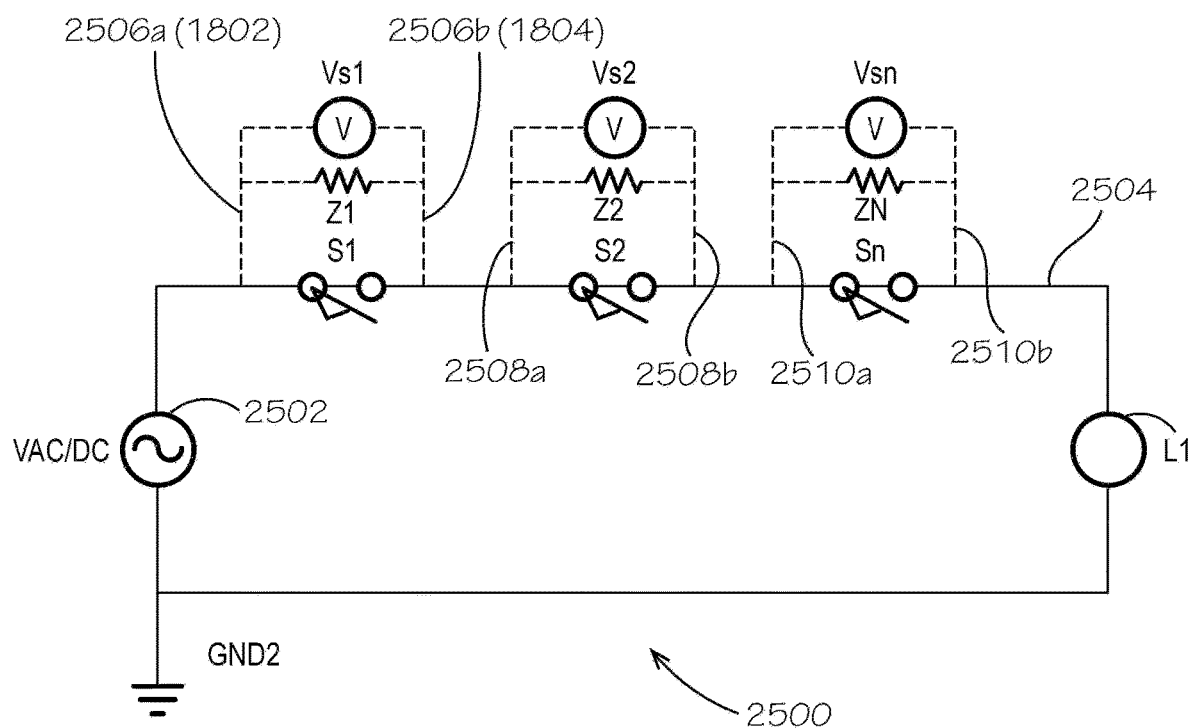
FIG. 23 is a schematic view of a connection arrangement between an elevator controller and an elevator monitor according to aspects of the present disclosure, the arrangement being an alternate to that shown in FIGS. 1 and 2, and in which the disclosed alternate arrangement assigns a differential amplifier for each switch in the elevator controller that is desired to be individually monitored.

FIG. 23 is a schematic view of a connection arrangement between an elevator controller and an elevator monitor according to further aspects of the present disclosure, the arrangement being an alternate to that shown in FIGS. 1 and 2, and in which the disclosed alternate arrangement assigns a differential amplifier for each switch in the elevator controller that is desired to be individually monitored. FIG. 23 depicts this alternate arrangement as a circuit 2500 including a voltage source 2502 and a load L1 connected by a line 2504, in which are situated a plurality of switches $S_1$, $S_2$, and $S_n$, where "n" can represent any number of switches. Three switches are shown in FIG. 23 for ease of illustration. Line 2504 represents any type of elevator control parameter line in an elevator controller 102 (FIG. 2), such as, for illustrative examples, the HDL line 160 or the DFO line 182 in FIG. 2. Similarly, load L1 represents any type of load connected to such elevator control parameter lines, such as, for illustrative examples, the HDL relay coil 168 or the DFO relay coil 186 in FIG. 2. Instead of connecting just a single differential amplifier to just two terminals per an entire elevator control parameter line, such as terminals 170,172 in the HDL line 160 of FIG. 2, the arrangement of FIG. 23 assigns a differential amplifier for each of the switches in the elevator control parameter line that are desired to be individually monitored. This is symbolically depicted in FIG. 23 by the voltages $V_{s1}$, $V_{s2}$, and $V_{sn}$, where the "n" is the total number of switches $S_n$ that are desired to be individually monitored. The voltages $V_{s1}$, $V_{s2}$, and $V_{sn}$ represent each calculated $V_{rms}$ value resulting from each input voltage 2001 (FIG. 20) that enters each corresponding differential amplifier, where each such differential amplifier can be constructed as shown in FIG. 18 at 101a. Each such $V_{rms}$ value can be calculated in the manner described above with regard to FIG. 20 at block 2010. Pairs of input lines 2506a,b, 2508a,b, and 2150a,b correspond to the inputs of respective differential amplifiers, such as the input terminals 1802,1804 of differential amplifier 101a (FIG. 18). Respectively connected between the input lines 2506a,b, 2508a,b, and 2150a,b are impedances $Z_1$, $Z_2$, and $Z_n$, each impedance primarily including, but not being limited to, the equivalent resistance resulting from resistors placed in the differential amplifier 101a as shown at $R_2$ and $R_3$ in FIG. 18.

The arrangement of FIG. 23 allows a combination of an elevator controller 102 and an elevator door monitor 100 to adapt to local building codes and/or regulations that require individual monitoring of one or more switches, without having to rearrange or re-configure the existing circuitry in an elevator controller 102 that may be built in the conventional manner exemplified in FIG. 2. Such rearranging has the inconvenience of being time-consuming, as well as requiring the assistance of technicians who possess a certain level of proficiency in how a particular elevator system works in order to implement any needed changes. Additionally, such rearranging could result in later difficulties when trying to troubleshoot the system, since technicians who were familiar with only the original configuration of the elevator controller 102 will require down-time in order to become familiar with the rearranged elevator controller 102.

Still referring to FIG. 23, if the impedance values for impedances $Z_1$, $Z_2$, and $Z_n$ are properly chosen, one can independently sense the status of each of the switches $S_1$, $S_2$, and $S_n$ without interfering with the original system behavior, that is, without affecting the behavior of the load L1. Properly-chosen impedance values will not affect such behavior, yet will result in a significantly different voltage at a switch when the switch is open instead of closed. As an example, assume that the voltage source 2502 is 120V, L1 is a relay coil having an impedance $Z_L$ of 10 kΩ, and the impedance $Z_1$ is 150 kΩ. If all switches $S_1$, $S_2$, and $S_n$ are closed, $V_{s1}$, $V_{s2}$, and $V_{sn}$ will all be close to zero volts, and the load L1 will get 120V, so there is no interference with the load behavior, and the door monitor 100 can know that all the switches $S_1$, $S_2$, and $S_n$ are closed because the voltage at each of the corresponding inputs is zero. Now assume that only $S_1$ is open. This results in the load L1 being in series with the 150 kΩ impedance, forming a voltage divider. The 120V of the voltage source is now divided in the same proportion of the impedance of the input module and the load L1: $V_{L1}=120*[Z_L/(Z_L+Z_1)]=120*[10K/(10K+150K)]=$ 7.5V, VS1=120−7.5=112.5V. Thus, with one switch open the load L1 is guaranteed only to see a maximum of 7.5V, which is very low to change from an inactive state to an active state. Any load that L1 could represent in an elevator system will need to see at least 35% of its rated voltage to change from an inactive state to an active state. In the example above, 7.5V corresponds to 6%. Also, since the voltage across $S_1$ is now 112.5V, the door monitor 100 knows that $S_1$ is open because it is reading a voltage level significantly different than zero. Now assume that all switches are opened. In this case, L1 is in series with 3*150 kΩ, and the voltage divider is such that L1 will see a much lower voltage than when only one switch was open, guaranteeing that L1 will not change from inactive to active. Calculating the voltages at L1 and at each input module (differential amplifier) in this scenario, the result is as follows: $V_{L1}$=2.60V, $V_{S1}$=$V_{S2}$=$V_{S3}$=39.13V. In this example, if the corresponding inputs of the door monitor 100 are set for 24V and HTH=66%, LTH=33% and Logic Active Low, it will know the status of each switch $S_1$, $S_2$, and $S_n$, independent of each other, without interfering the original behavior of L1, and without changing the original wiring of the switches $S_1$, $S_2$, and $S_n$.

Figure 14B:
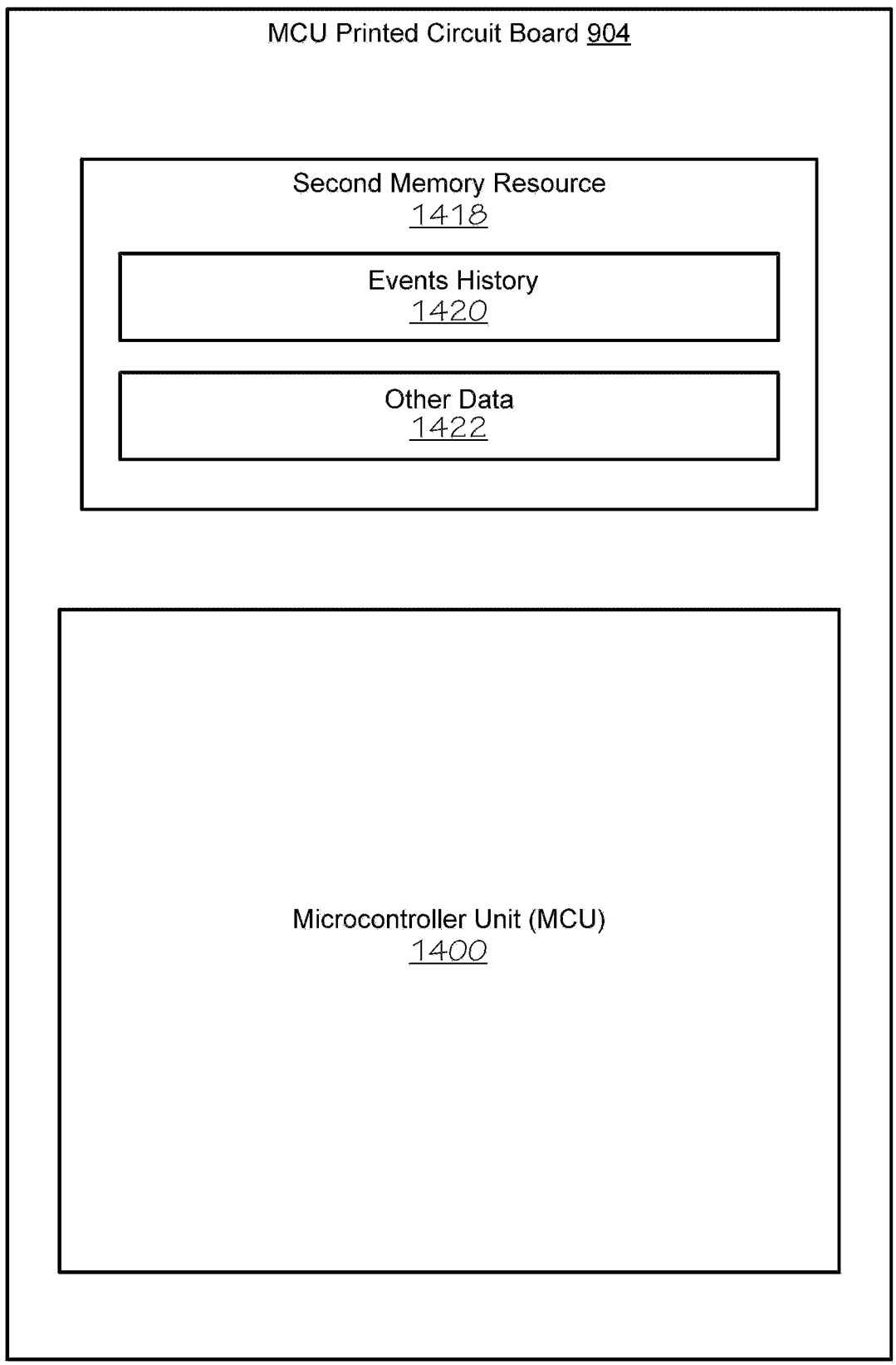
FIG. 14B is a block diagram showing the relationship of the microcontroller unit of FIG. 14A to a second memory resource, which is shown to store event history information along with other data.

FIGS. 24A-24L illustrate example screen shots demonstrating various aspects of graphical user interfaces (GUIs) presented by LCD and touch screen 114 of the elevator door monitor 100 according to aspects of the present disclosure. The touch screen 114 is configured to provide a plurality of GUIs through which a user may store a plurality of setting values into either or both of the memory resources 1402 and 1418 (FIGS. 14A and 14B).

Figure 24A:
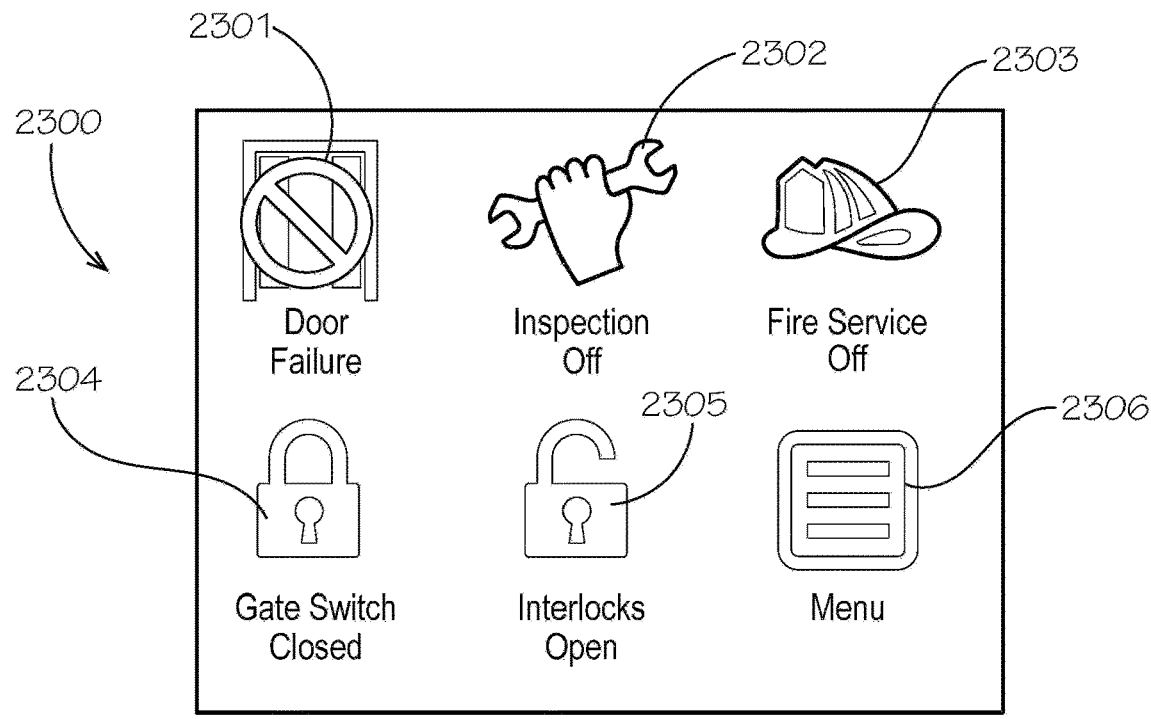
FIGS. 24A-24L illustrate example screen shots demonstrating various aspects of graphical user interfaces presented by an LCD and touch screen in an elevator door monitor according to aspects of the present disclosure.

FIG. 24A illustrates a GUI comprising a main status screen 2300, the main status screen 2300 comprising a door status icon 2301, an inspection status icon 2302, a fire service icon 2303, a gate switch status icon 2304, an interlocks status icon 2305, and a menu icon 2306. The door status icon 2301 is illustrated as depicting a state of door failure, but it can change its appearance to reflect other states of the elevator door being monitored, such as door open, door open halfway, and door closed. The inspection status icon 2302 can toggle between two different colors along with its caption changing according to whether the elevator car being monitored is detected to be in inspection mode. The inspection status icon 2302 can, for example, turn blue when inspection mode is on, and turn gray when the elevator car is not in that mode. The fire service icon 2303, which indicates whether the monitored elevator car is in FS2 mode, can toggle between two different colors along with its caption changing according to whether the elevator car being monitored is detected to be in FS2 mode. The fire service icon 2303 can, for example, turn red when the elevator car is in FS2 mode, and turn gray when the elevator car is not in that mode. Regarding both the gate switch status icon 2304 and the interlocks status icon 2305, a "closed" lock position indicates the signals are active, and an "open" lock position indicates the signals are not active.

Figure 24B:
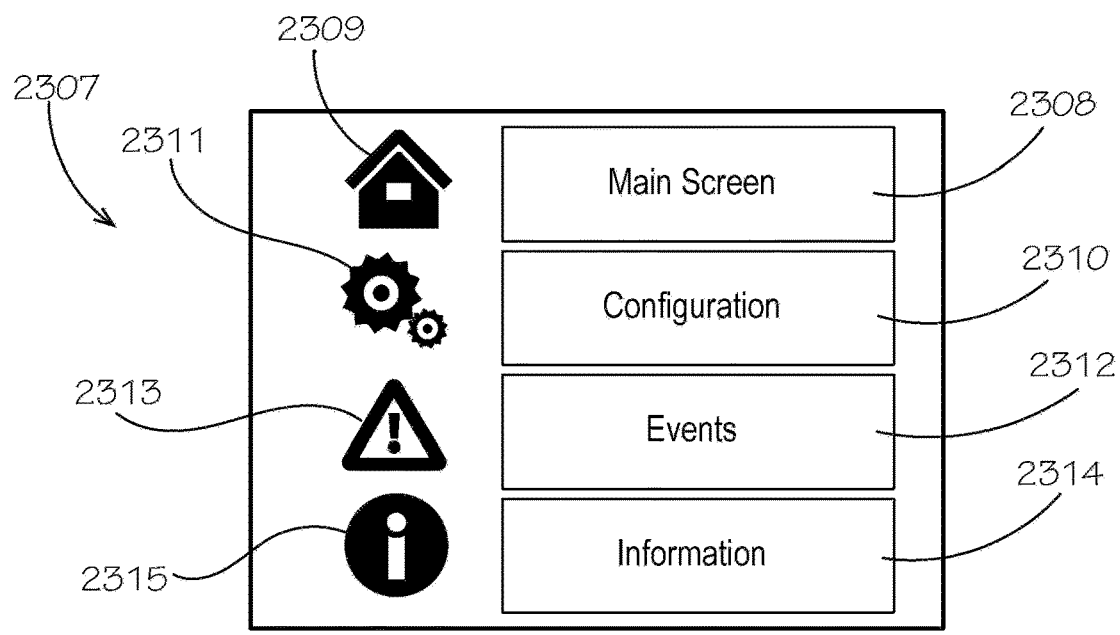

Referring both to FIGS. 24A and 24B, the menu icon 2306 is configured to, responsive to a touch by a user, cause the touch screen 114 to display a main menu screen 2307, the main menu screen 2307 comprising a "Main Screen" button 2308 adjacent a house icon 2309, a "Configuration" button 2310 adjacent a settings icon 2311, an "Events" button 2312 adjacent a notification icon 2313, and an "Information" button 2314 adjacent an information icon 2315. The "Main Screen" button 2308, when touched, causes the touch screen 114 to once again display the main status screen 2300.

Figure 24C:
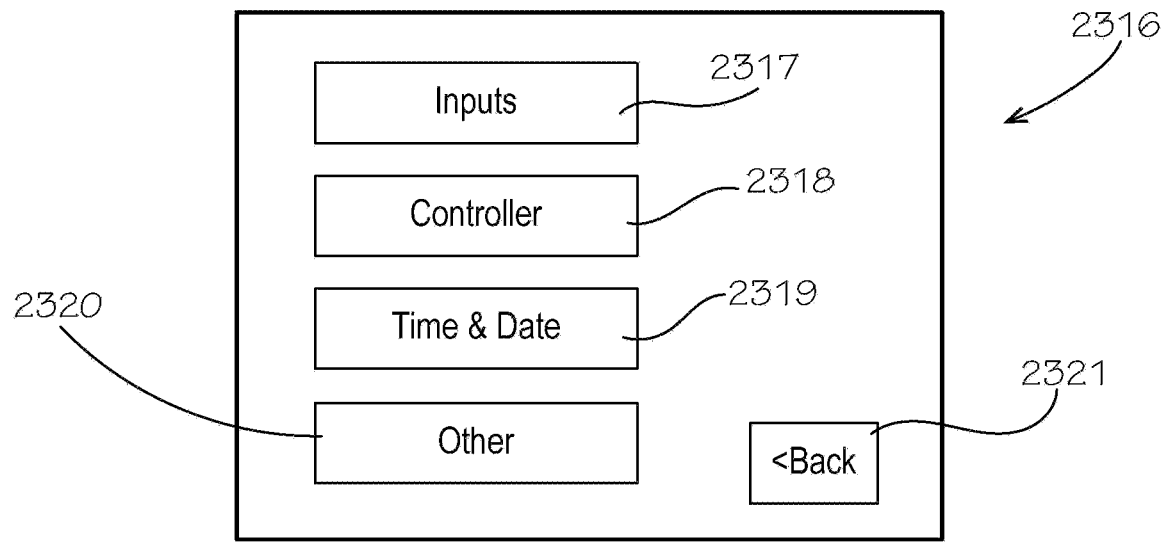

Referring to both FIGS. 24B and 24C, the "Configuration" button 2310 is configured to, responsive to a touch by the user, cause the touch screen 114 to display a signal configuration screen 2316 comprising an "Inputs" button 2317, a "Controller" button 2318, a "Time & Date" button 2319, an "Other" button 2320, and a "Back" button 2321 that, when pressed, causes the touch screen 114 to once again display the main menu screen 2307.

Figure 24D:
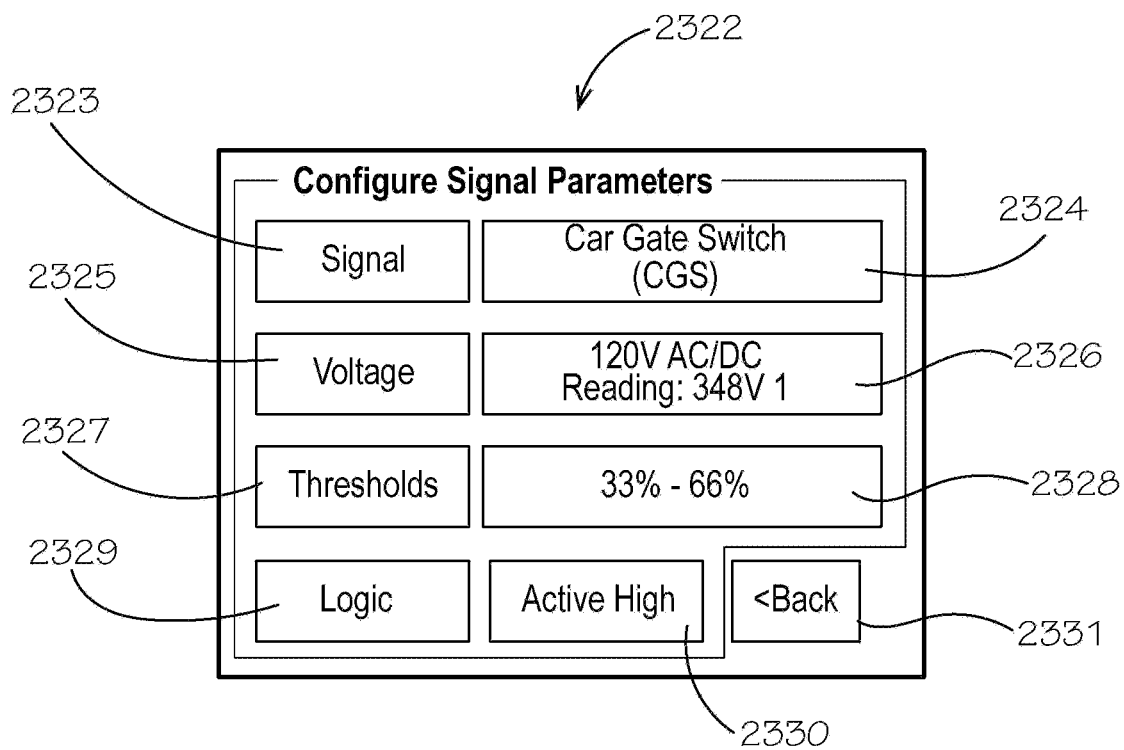
Figure 24E:
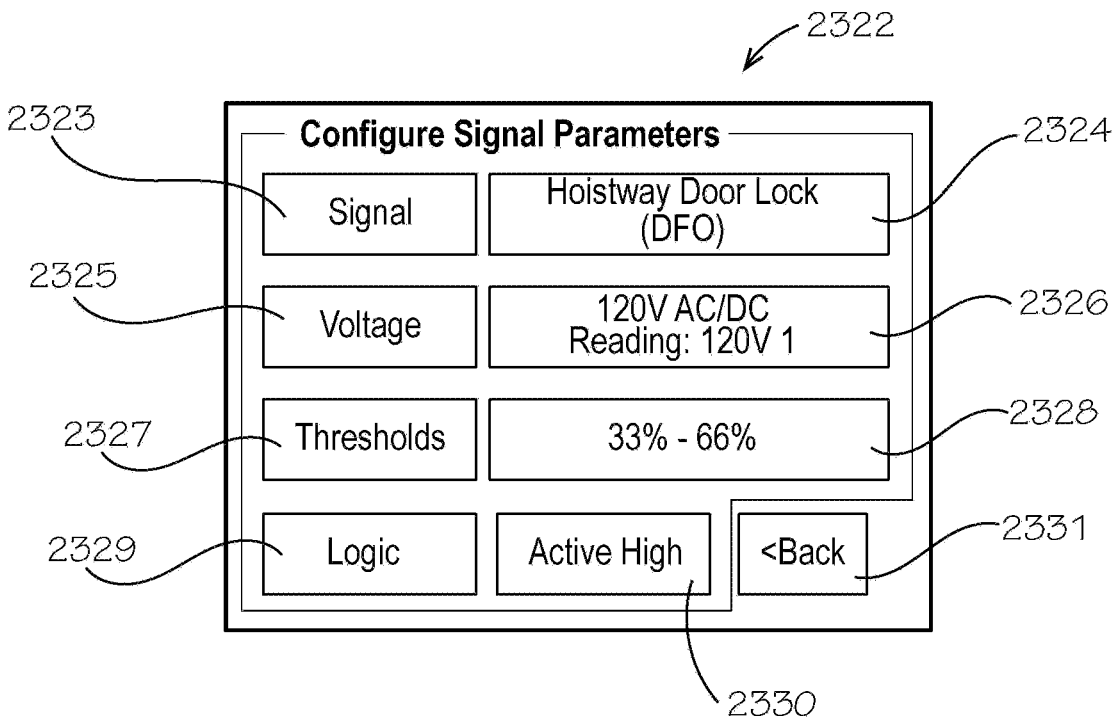
Figure 24F:
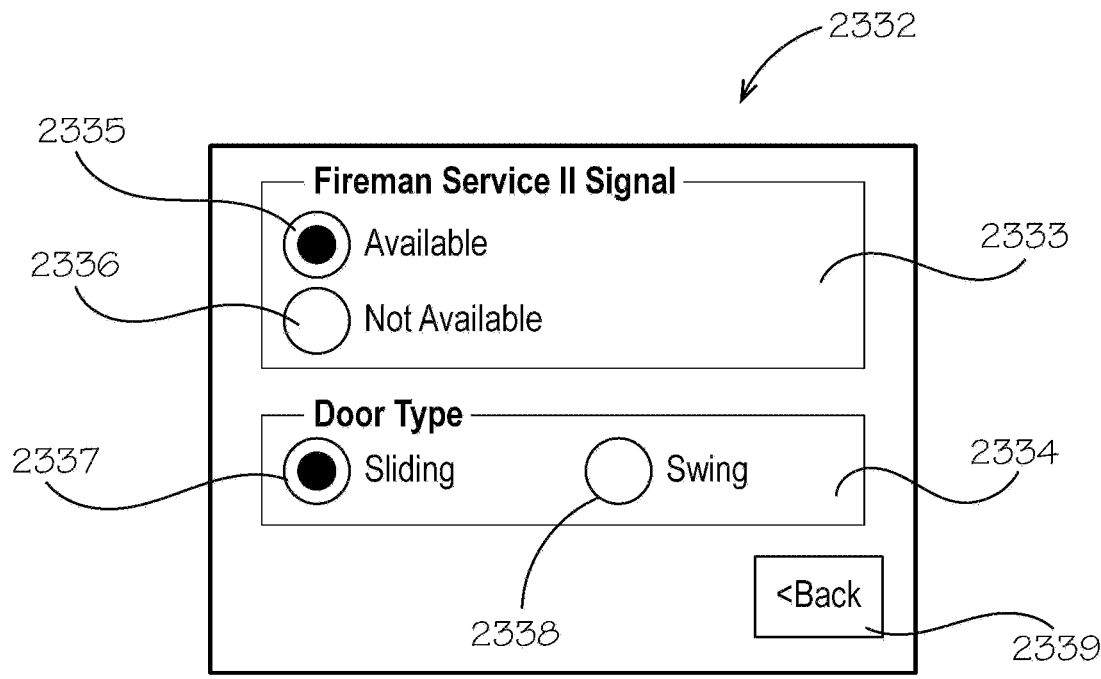

Referring to FIGS. 24C, 24D, and 24E, the "Inputs" button 2317 is configured to, responsive to a touch by the user, display a signal configuration screen 2322 comprising a "Signal" button 2323, a signal selection region 2324 adjacent the "Signal" button 2323, a "Voltage" button 2325, a voltage selection region 2326 adjacent the "Voltage" button 2325, a "Thresholds" button 2327, a threshold selection region 2328 adjacent the "Thresholds" button 2327, a "Logic" button 2329, a logic selection region 2330 adjacent the "Logic" button 2329, and a "Back" button 2331 that, when pressed, causes the touch screen 114 to once again display the signal configuration screen 2316. The signal selection region 2324 is configured to display a name of an elevator control parameter (CGS in the example of FIG. 24D, HDL in the example of FIG. 24E). The "Signal" button 2323 is configured to, responsive to a touch by the user, cause a name of another elevator control parameter to be displayed in the signal selection region 2324 in place of the name of the first-displayed elevator control parameter. Thus, using the illustrated examples, pressing "Signal" button 2323 can cause the signal selection region 2324 to transition from the "CGS" display in FIG. 24D to the "HDL" display in FIG. 24E. Successive presses of "Signal" button 2323 by the user will cause the signal selection region 2324 to successively display still more names of different elevator control parameters. The voltage selection region 2326 is configured to display a change-of-state voltage magnitude for the parameter displayed in the signal selection region 2324. The user will know what value to select based on the determination of contact location in the elevator controller 102 and the determination of the voltage associated with a parameter change of state, in the manner discussed above with regard to FIG. 2. The voltage selection region 2324 also displays an actual voltage across the aforementioned selected elevator control contacts (348V in the example of FIG. 24D, 120V in the example of FIG. 24E). The "Voltage" button 2325 is configured to, responsive to a touch by the user, cause a second change-of-state voltage magnitude to be displayed in the voltage selection region 2324 in place of the first change-of-state voltage magnitude. The threshold selection region 2328 is configured to display a percentage pair (33% and 66% in the examples of FIGS. 24D and 24E), a first numeral in the pair defining a percentage that, when multiplied by the voltage magnitude recited in the voltage selection region 2326, equals the low threshold setting (LTS 2114, FIG. 21), and the second numeral in the percentage pair defining a percentage that, when multiplied by the voltage magnitude recited in the voltage selection region 2326, equals the high threshold setting (HTS 2112, FIG. 21). The "Thresholds" button 2327 is configured to, responsive to a touch by the user, cause a second pair of percentages to be displayed in the threshold selection region 2328 in place of a first pair of percentages. The logic selection region 2330 is configured to display either the words "Active High" or the words "Active Low." The "Logic" button is configured to, responsive to a touch by the user, cause the logic selection region 2330 to toggle between displays of the words "Active High" and the words "Active Low."

The "Controller" button 2318 of the signal configuration screen 2316 (FIG. 24C) is configured to, responsive to a touch by the user, cause the touch screen 114 to display a controller characteristics configuration screen 2332 (FIG. 24F), the controller characteristics configuration screen 2332 comprising an upper region 2333 and a lower region 2334, the upper region 2333 containing two upper radio buttons 2335,2336 through which the user may indicate whether a FS2 signal is available, and the lower region 2334 containing two lower radio buttons 2337,2338 through which the user can select an elevator door type as between a sliding door and a swinging door. The controller characteristics configuration screen 2332 can also be provided with a "Back" button 2339 that, when pressed, causes the touch screen 114 to once again display the signal configuration screen 2316 (FIG. 24C).

Figure 24G:
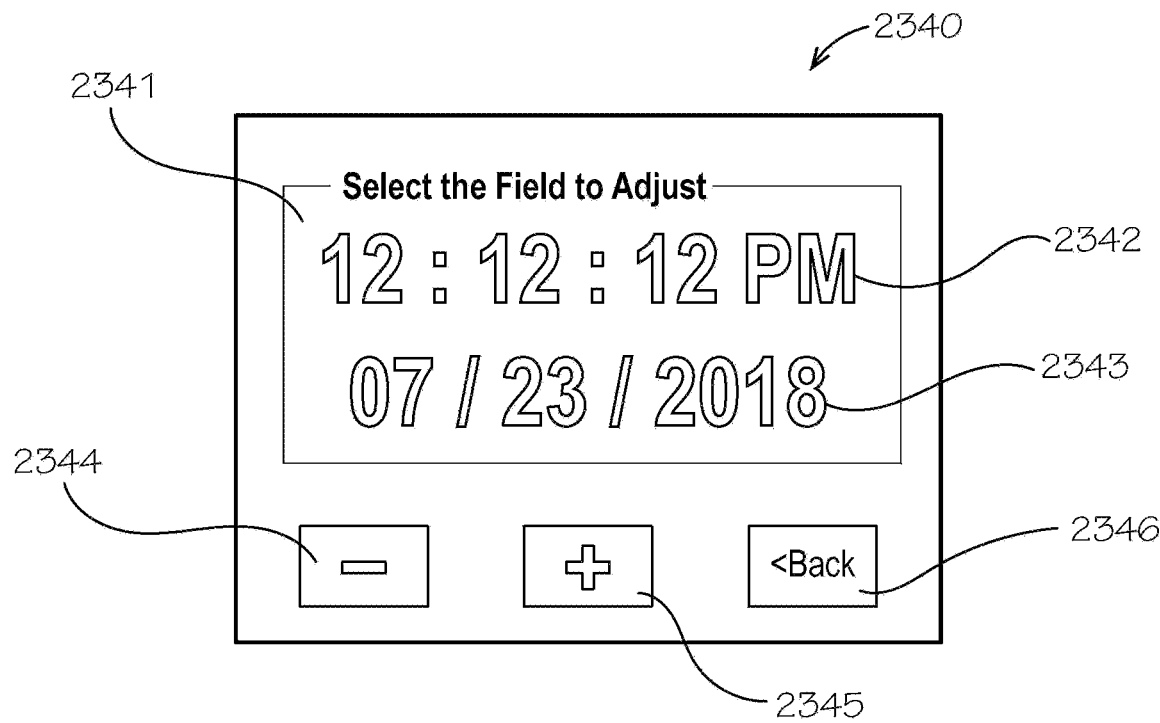
Figure 24H:
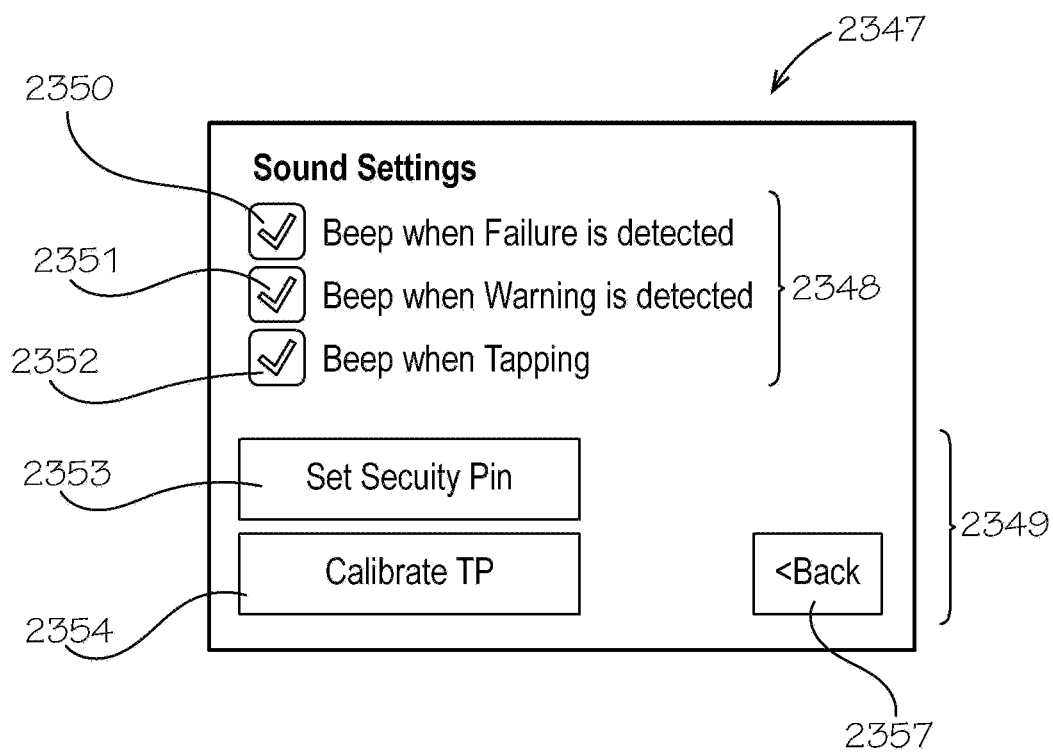
Figures 24I, 24J:
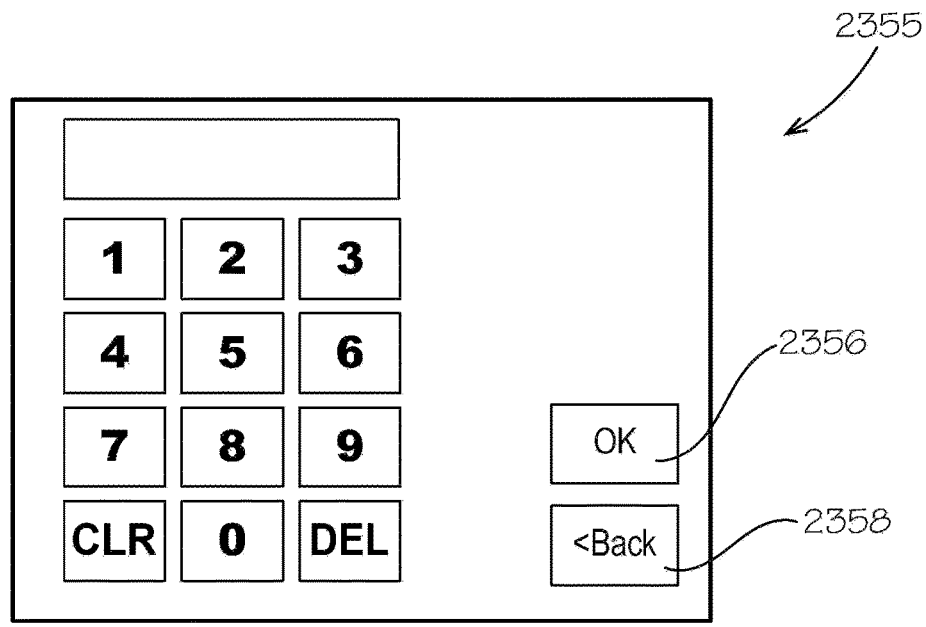
Figure 24K:
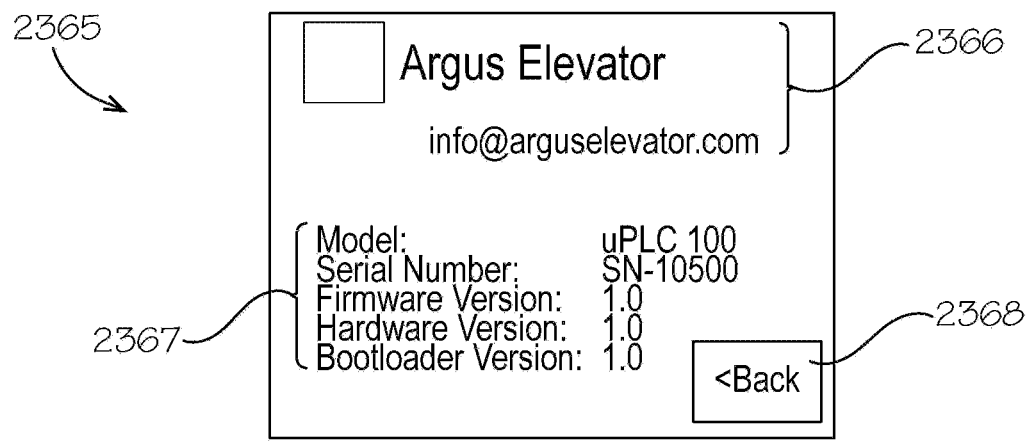
Figure 24L:
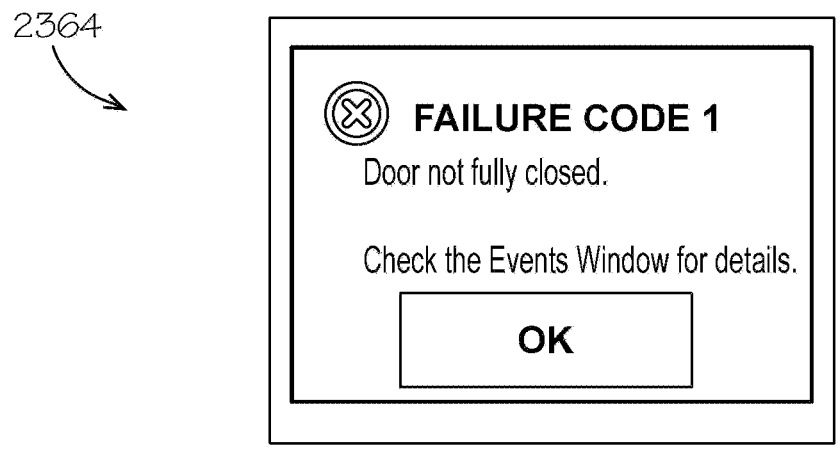

The "Time & Date" button 2319 of the signal configuration screen 2316 (FIG. 24C) is configured to, responsive to a touch by the user, cause the touch screen 114 to display the time-and-date screen 2340 shown in FIG. 24G. Time-and-date screen 2340 includes a display region 2341 reciting both time information 2342 and date information 2343. Region 2341 allows the user to select which item of information 2342,2343 to adjust. Using down-increment button 2344 or up-increment button 2345, the user can adjust the selected information item. Time-and-date screen 2340 is provided with a "Back" button 2346 that, when pressed, causes the touch screen 114 to once again display the signal configuration screen 2316 (FIG. 24C).

The "Other" button 2320 of the signal configuration screen 2316 (FIG. 24C) is configured to, responsive to a touch by the user, cause the touch screen 114 to display the settings screen 2347 illustrated in FIG. 24H. The settings screen 2347 comprises an upper region 2348 and a lower region 2349, the upper region 2348 configured to enable the user to select at least one beeping condition during which the MCU 1400 (FIG. 15) will command an audio element to beep. Such an audio element can be in communication with the MCU 1400, the audio element configured to beep responsive to a command received from the MCU 1400. Settings screen 2347 recites beeping conditions, a first beeping condition 2350 comprising detection of a failure, a second beeping condition 2351 comprising detection of a warning, and a third beeping condition 2352 comprising tapping the touch screen 114. The lower region 2349 of settings screen 2347 contains a "Set Security Pin" button 2353, which is configured to, responsive to a touch by the user, cause the touch screen 114 to display a numeric touchpad screen 2355 (FIG. 24I) configured to enable the user to store, by pressing the "OK" button 2356, a personal identification number into a memory such as the second memory resource 1418 (FIG. 14B). Lower region 2349 also contains a touch screen calibration button 2354. The settings screen 2347 is provided with a "Back" button 2357 that, when pressed, causes the touch screen 114 to once again display the signal configuration screen 2316 (FIG. 24C). Similarly, the numeric touchpad screen 2355 is provided with a "Back" button 2358 that, when pressed, causes the touch screen 114 to once again display the settings screen 2347 (FIG. 24H).

The "Events" button 2312 of the main menu screen 2307 (FIG. 24B) is configured to, responsive to a touch by the user, cause the touch screen 114 to display an events history screen 2359 (FIG. 24J), the events history screen 2359 displaying event data stored in memory including the first memory resource 1402 and/or the second memory resource 1418 (FIGS. 14A and 14B). The event data comprises, for each stored event, an event type 2360, a time 2361 at which the event occurred, and a date 2362 on which the event occurred. The events history screen 2359 is provided with a "Back" button 2357 that, when pressed, causes the touch screen 114 to once again display the main menu screen 2307 (FIG. 24B). It should be understood that some events that can be summarized in the events history screen 2359 can be not merely change of state of a monitored signal, but instead events that are the result of certainty combinations of signals as determined by an algorithm ran by the MCU 1400 (FIG. 15). One such event, for example, is associated with faulty door contacts. If both the DFO and DFC signals are true at the same time, a Door Failure event is triggered (an example of a failure message screen shown in FIG. 24L), since a door cannot be both fully open and fully closed at the same time. In this case, events showing when the DFO and DFC changed are displayed in the events history screen 2359, in addition to the event that represents failure. In that case, the event representing the failure will have the same time stamp as the DFO or DFC event that actually triggered the door failure event. There could also be warning events corresponding to internal state of the device, like an undesirably high temperature, or loss of communication with the second memory resource 1418 (FIG. 14B) or with the RTC 1502 (FIGS. 15 and 17) or with low main power voltage, etc.

The "Information" button 2314 of the main menu screen 2307 (FIG. 24B) is configured to, responsive to a touch by the user, cause the touch screen 114 to display an information screen 2365 (FIG. 24K), which can display manufacturer/supplier information 2366 and device/hardware/firmware information 2367. The information screen 2365 is provided with a "Back" button 2368 that, when pressed, causes the touch screen 114 to once again display the main menu screen 2307 (FIG. 24C).

Figure 25:
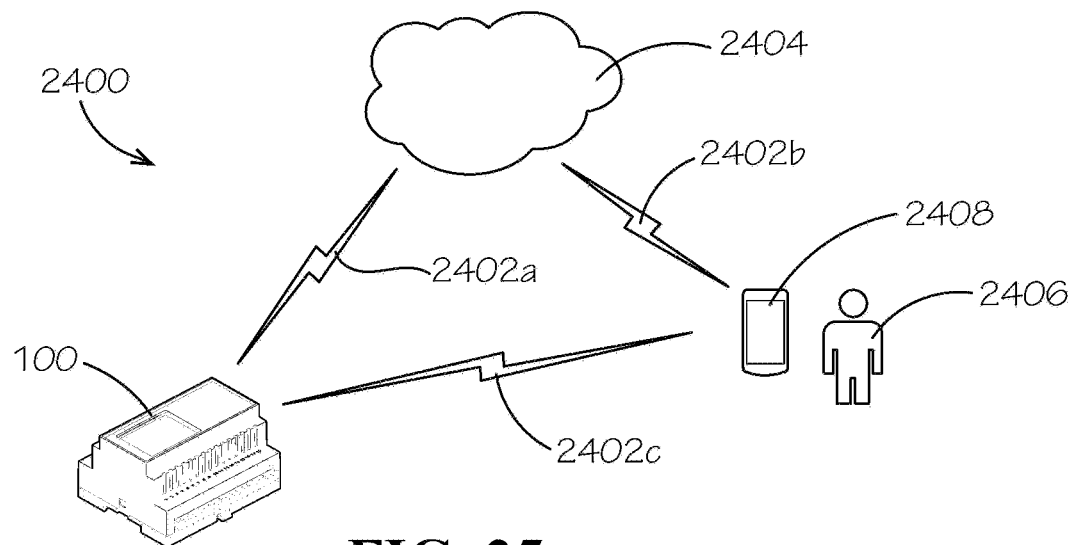
FIG. 25 is a block diagram depicting an elevator door monitor operating in an exemplary interactive environment according to aspects of the present disclosure.

FIG. 25 is a block diagram depicting an elevator door monitor 100 operating in an exemplary interactive environment 2400 according to aspects of the present disclosure. Wireless module 118 (FIG. 1) permits two-way communication between the elevator door monitor 100 and a cloud 2404 via a communication link 2402a. Cloud 2404 can represent, for example, be a remote monitoring system, but it is to be understood that cloud 2404 is not necessarily limited to such a system. As explained with regard to cloud computing generally in U.S. Patent Application Publication No. 2014/0379910 to Saxena et al., cloud 2404 can include "a collection of hardware and software that forms a shared pool of configurable computing resources (e.g., networks, servers, storage, applications, services, etc.), which can be suitably provisioned to provide on-demand self-service, network access, resource pooling, elasticity and measured service, among other features." Cloud 2402 may be deployed as a private cloud (e.g., infrastructure operated by a single enterprise/organization), community cloud (e.g., infrastructure shared by several organizations to support a specific community that has shared concerns), public cloud (e.g., infrastructure made available to the general public, such as the Internet), or a suitable combination of two or more disparate types of clouds. In this description, "cloud computing" is defined as a model for enabling on-demand network access to a shared pool of configurable computing resources (e.g., networks, servers, storage, applications, and services). As stated in U.S. Patent Application Publication No. 2014/0075431 to Kumar et al: "Generally, a cloud computing model enables some of those responsibilities which previously may have been provided by an organization's own information technology department, to instead be delivered as service layers within a cloud environment, for use by consumers (either within or external to the organization, according to the cloud's public/private nature)." As further explained in the aforementioned Kumar et al. patent application, a cloud computing model can take the form of various service models such as, for example, Software as a Service ("SaaS"), "in which consumers use software applications that are running upon a cloud infrastructure, while a SaaS provider manages or controls the underlying cloud infrastructure and applications," and Platform as a Service ("PaaS"), "in which consumers can use software programming languages and development tools supported by a PaaS provider to develop, deploy, and otherwise control their own applications, while the PaaS provider manages or controls other aspects of the cloud environment (i.e., everything below the run-time execution environment)." The definition of "cloud computing" is not limited to any of the other numerous advantages that can be obtained from such models when properly deployed. Given such functionality of cloud 2404, a remote user 2406 can access services provided in the cloud 2404 via a remote device such as cell phone (smartphone) 2408 for purposes of remotely communicating with the elevator door monitor 100.

Still referring to FIG. 25, elevator door monitor 100 can also, in some implementations, be configured to communicate directly, via a communication link 2402c, to the cell phone 2408 of the remote user 2406. Using either or both of the aforementioned methods of remote communication, the remote user 2406 is able to exchange various kinds of data with the elevator door monitor 100. For example, via the cell phone 2408, a text communication from the remote user 2406 to the elevator door monitor 100 may state: "Send me a history of events." See the above discussion of event history with regard to FIG. 24J. In response to that text communication, the elevator door monitor 100 can access the stored events history and reply with the history information, sending it as a text reply to the cell phone 2408. As another example, remote user 2406 could send a text: "Activate 3rd contact." As previously explained with regarding to FIG. 1, a third set of output contacts could comprise controls for LEDs or an alarm. Thus in response to the quoted text, the elevator door monitor can activate (or de-activate) a light indicator or an alarm. However, it is presently contemplated that the elevator door monitor 100 would preferably be configured so that no command sent remotely would change any configuration settings of the types described above with regard to FIGS. 24A-24L.

The communication links 2402 shown in FIG. 25 represent a network or networks that may comprise hardware components and computers interconnected by communications channels that enable sharing of resources and information. The network may comprise one or more of a wired, wireless, fiber optic, or remote connection via a telecommunication link, an infrared link, a radio frequency link, a cellular link, a Bluetooth® link, or any other suitable connectors or systems that provide electronic communication. The network may comprise intermediate proxies, routers, switches, load balancers, and the like. The paths followed by the network between the devices as depicted in FIG. 25 represent the logical communication links between those devices, not necessarily the physical paths or links between and among the devices.

Although several aspects have been disclosed in the foregoing specification, it is understood by those skilled in the art that many modifications and other aspects will come to mind to which this disclosure pertains, having the benefit of the teaching presented in the foregoing description and associated drawings. For example, regarding the entry of numeric setting information through GUIs, instead of choosing from a preselected list of values as discussed with regard to display regions 2326 and 2328 of the signal configuration screen 2322 FIGS. 24D and 24E), a user could navigate to a numeric keypad screen (FIG. 24I) and enter specific values directly into those display regions 2326 and 2328. It is thus understood that the disclosure is not limited to the specific aspects disclosed hereinabove, and that many modifications and other aspects are intended to be included within the scope of any claims that can recite the disclosed subject matter.

One should note that conditional language, such as, among others, "can," "could," "might," or "may," unless specifically stated otherwise, or otherwise understood within the context as used, is generally intended to convey that certain aspects include, while other aspects do not include, certain features, elements and/or steps. Thus, such conditional language is not generally intended to imply that features, elements and/or steps are in any way required for one or more particular aspects or that one or more particular aspects necessarily comprise logic for deciding, with or without user input or prompting, whether these features, elements and/or steps are included or are to be performed in any particular aspect.

It should be emphasized that the above-described aspects are merely possible examples of implementations, merely set forth for a clear understanding of the principles of the present disclosure. Any process descriptions or blocks in flow diagrams should be understood as representing modules, segments, or portions of code which comprise one or more executable instructions for implementing specific logical functions or steps in the process, and alternate implementations are included in which functions may not be included or executed at all, can be executed out of order from that shown or discussed, including substantially concurrently or in reverse order, depending on the functionality involved, as would be understood by those reasonably skilled in the art of the present disclosure. Many variations and modifications can be made to the above-described aspect(s) without departing substantially from the spirit and principles of the present disclosure. Further, the scope of the present disclosure is intended to cover any and all combinations and sub-combinations of all elements, features, and aspects discussed above. All such modifications and variations are intended to be included herein within the scope of the present disclosure, and all possible claims to individual aspects or combinations of elements or steps are intended to be supported by the present disclosure.

That which is claimed is:

1. An elevator door monitor, comprising:
a differential amplifier having an input and an output, the input configured to electrically communicate with a source configured to output one of a change-of-state voltage with respect to an elevator control parameter and a change-of-state voltage value with respect to the elevator control parameter, the differential amplifier configured to produce an output voltage correlating to a magnitude of one of the change-of-state voltage and the change-of-state voltage value; and
a microcontroller in communication with the output of the differential amplifier, the microcontroller configured to convert the output voltage from the differential amplifier to a numeric value,
compare the numeric value to a setting value, and
responsive to a determination that the numeric value reaches a threshold associated with the setting value, send a signal to an output relay control module, the signal comprising one selected from the group of a "true" signal and a "false" signal, the output relay control module configured to perform a determination that controls operation of an output interface according to the signal received from the microcontroller;
wherein the output interface communicates with the microcontroller and with an elevator controller, the output interface configured to send an output signal to the elevator controller pursuant to said determination to allow the elevator controller to take an action with respect to one selected from an elevator car and a landing door.

2. The elevator door monitor of claim 1, wherein the source is one selected from a set of terminals in the elevator controller and a sensor mounted to an elevator car.

3. The elevator door monitor of claim 2, wherein the set of terminals comprises one terminal on either side of a relay coil in the elevator controller.

4. The elevator door monitor of claim 2,
wherein the elevator controller comprises an elevator control parameter line and a switch in the elevator control parameter line, and
wherein the set of terminals comprises one terminal on either side of the switch.

5. The elevator door monitor of claim 4,
wherein a plurality of switches are connected in series in the elevator control parameter line,
wherein the source is one of a plurality of sources, the plurality of sources comprising a plurality of sets of terminals, each set of terminals in the plurality of sets of terminals comprising one terminal on either side of each switch in the plurality of switches, and
wherein the differential amplifier is one in a plurality of differential amplifiers, each differential amplifier electrically communicating with a set of terminals in the plurality of sets of terminals,
wherein a state of each switch in the plurality of switches can be independently monitored.

6. The elevator door monitor of claim 2, further comprising:
a Universal Asynchronous Receiver/Transmitter (UART) interface in electrical communication with the microcontroller; and
a wireless module connected to the UART interface,
wherein the microcontroller is further configured to wirelessly communicate with the sensor via the wireless module.

7. The elevator door monitor of claim 6, wherein the microcontroller is further configured to communicate, via the wireless module, with a recipient comprising at least one selected from the group of a cloud and a cellular phone.

8. The elevator door monitor of claim 1, further comprising:
a Universal Asynchronous Receiver/Transmitter (UART) interface in electrical communication with the microcontroller;
wherein the UART interface is configured to permit two-way communication between the microcontroller and a computer external to the microcontroller;
wherein the microcontroller is further configured to store the setting value responsive to a command received from the computer.

9. The elevator door monitor of claim 1, wherein the elevator control parameter is one selected from the group of Door Gate Switch, Hoistway Door Lock, Door Fully Open, Door Fully Closed, Fire Service Phase II, and Inspection Mode.

10. The elevator door monitor of claim 1,
wherein the threshold comprises one selected from the group of a high threshold associated with the setting value and a low threshold associated with the setting value, and
wherein the microcontroller is further configured to
operate in an "active high" mode with respect to the elevator control parameter,
send a "true" signal to the output relay control module when the numeric value equals or exceeds the high threshold, and
send a "false" signal to the output relay control module when numeric value is less than the low threshold.

11. The elevator door monitor of claim 1,
wherein the threshold comprises one selected from the group of a high threshold associated with the setting value and a low threshold associated with the setting value, and
wherein the microcontroller is further configured to
operate in an "active low" mode with respect to the elevator control parameter,
send a "true" signal to the output relay control module when the numeric value is less than the low threshold, and
send a "false" signal to the output relay control module when the numeric value equals or exceeds the high threshold.

12. The elevator door monitor of claim 1, wherein the setting value for the elevator control parameter is at least one selected from the group of a voltage magnitude defining the change-of-state voltage, a high threshold associated with the setting value, a low threshold associated with the setting value, and selection between "active high" and "active low" as a state in which the microcontroller will generate the "true" signal.

13. The elevator door monitor of claim 1, wherein the microcontroller further comprises a memory resource, and further comprising a touch screen in communication with the microcontroller, the touch screen configured to provide a graphical user interface (GUI) through which a user may store the setting value into the memory resource.

14. The elevator door monitor of claim 13,
wherein the setting value is one of a plurality of setting values,
wherein the GUI is one of a plurality of GUIs, and
wherein the touch screen is further configured enable storage of the plurality of setting values into the memory resource through the plurality of GUIs.

15. The elevator door monitor of claim 14, wherein the plurality of GUIs comprises:
a main status screen, the main status screen comprising at least one selected from the group of a door status icon, an inspection status icon, a fire service icon, a gate switch status icon, an interlocks status icon, and a menu icon,
wherein the menu icon is configured to, responsive to a first touch by a user, cause the touch screen to display a main menu screen, the main menu screen comprising at least one selected from the group of a "Main Screen" button, a "Configuration" button, an "Events" button, and an "Information" button.

16. The elevator door monitor of claim 15,
wherein the "Configuration" button is configured to, responsive to a second touch by the user, cause the touch screen to display a signal configuration screen comprising at least one selected from the group of an "Inputs" button, a "Controller" button, a "Time & Date" button, and an "Other" button.
wherein the "Inputs" button is configured to, responsive to a third touch by the user, display a signal configuration screen comprising a "Signal" button, a signal selection region adjacent the "Signal" button, a "Voltage" button, a voltage selection region adjacent the "Voltage" button, a "Thresholds" button, a threshold selection region adjacent the "Thresholds" button, a "Logic" button, and a logic selection region adjacent the "Logic" button,
wherein the elevator control parameter is a first elevator control parameter,
wherein the signal selection region is configured to display a name of the first elevator control parameter, and
wherein the "Signal" button is configured to, responsive to a fourth touch by the user, cause a name of a second elevator control parameter to be displayed in the signal selection region in place of the name of the first elevator control parameter, wherein the magnitude of the change-of-state voltage is a first change-of-state voltage magnitude, wherein the voltage selection region is configured to display the first change-of-state voltage magnitude, and wherein the "Voltage" button is configured to, responsive to a fifth touch by the user, cause a second change-of-state voltage magnitude to be displayed in the voltage selection region in place of the first change-of-state voltage magnitude, wherein threshold selection region is configured to display a first pair of percentages, a first numeral in the first pair of percentages defining a percentage that, when multiplied by a voltage magnitude recited in the voltage selection region, equals a low threshold setting, and a second numeral in the first pair of percentages defining a percentage that, when multiplied by the voltage magnitude recited in the voltage selection region, equals a high threshold setting, wherein the "Thresholds" button is configured to, responsive to a sixth touch by the user, cause a second pair of percentages to be displayed in the threshold selection region in place of the first pair of percentages, and wherein the logic selection region is configured to display one selected from the group of an "Active High" recitation and am "Active Low" recitation, and wherein the "Logic" button is configured to, responsive to a seventh touch by the user, cause the logic selection region to toggle between displays of the "Active High" recitation and the "Active Low" recitation.

17. The elevator door monitor of claim 16, wherein the "Controller" button is configured to, responsive to an eighth touch by the user, cause the touch screen to display a controller characteristics configuration screen, the controller characteristics configuration screen comprising an upper region and a lower region, the upper region containing two upper radio buttons through which the user may indicate whether a Fireman Service II signal is available, and the lower region containing two lower radio buttons through which the user can select an elevator door type as between a sliding door and a swinging door.

18. The elevator door monitor of claim 16, wherein the memory resource is a first memory resource, and further comprising:
a second memory resource in communication with the microcontroller; and
an audio element in communication with the microcontroller, the audio element configured to beep responsive to a command received from the microcontroller;
wherein the "Other" button is configured to, responsive to an eighth touch by the user, cause the touch screen to display a settings screen comprising an upper region and a lower region,
the upper region configured to enable the user to select at least one beeping condition during which the microcontroller will command the audio element to beep, the beeping condition comprising at least one selected from the group of detection of a failure, detection of a warning, and tapping the touch screen, and
the lower region containing a "Set Security Pin" button, wherein the "Set Security Pin" button is configured to, responsive to a ninth touch by the user, cause the touch screen to display a numeric touchpad screen configured to enable the user to store a personal identification number into the second memory resource.

19. The elevator door monitor of claim 15, wherein the memory resource is a first memory resource, and further comprising a second memory resource in communication with the microcontroller, wherein the "Events" button is configured to, responsive to a second touch by the user, cause the touch screen to display an events history screen, the events history screen displaying event data stored in at least one selected from the group of the first memory resource and the second memory resource, the event data comprising, for each stored event, an event type, a time at which the event occurred, and a date on which the event occurred.

20. A method, comprising the steps of:
receiving a change-of-state voltage from a source, the change-of-state voltage generated by the source upon an occurrence of an event associated with an elevator control parameter;
generating a numeric value corresponding to a magnitude of the change-of-state voltage;
comparing the numeric value to a setting value;
responsive to a determination that the numeric value reaches a threshold associated with the setting value, send a signal to an output relay control module, the signal comprising one selected from the group of a "true" signal and a "false" signal;
performing, with the output relay control module, a determination that controls operation of an output interface according to the signal received; and
sending an output signal, by the output interface, to an elevator controller pursuant to said determination to allow the elevator controller to take an action with respect to one selected from an elevator car and a landing door.

21. The method of claim 20, wherein the step of generating a numeric value further comprises the steps of:
attenuating a magnitude of the change-of-state voltage to produce an attenuated voltage;
outputting the attenuated voltage to a microcontroller; and
causing the microcontroller to calculate a numeric value corresponding to the attenuated voltage, the numeric value expressed in units of root-mean-square voltage ($V_{rms}$).

22. The method of claim 21, wherein the step of outputting the attenuated voltage to the microcontroller comprises sending the attenuated voltage to a single input of the microcontroller, the single input configured to receive signals specific to one type of an elevator control parameter.

23. The method of claim 21, further comprising the step of, after the attenuating step, applying low-pass filtering to the signal.

* * * * *